US010680579B2

(12) United States Patent
Kato et al.

(10) Patent No.: US 10,680,579 B2
(45) Date of Patent: Jun. 9, 2020

(54) HIGH FREQUENCY MODULE

(71) Applicant: Murata Manufacturing Co., Ltd., Nagaokakyo-shi, Kyoto-fu (JP)

(72) Inventors: Masanori Kato, Nagaokakyo (JP); Shinya Mizoguchi, Nagaokakyo (JP); Yukiteru Sugaya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/545,243

(22) Filed: Aug. 20, 2019

(65) Prior Publication Data

US 2019/0379350 A1  Dec. 12, 2019

Related U.S. Application Data

(63) Continuation of application No. 15/794,073, filed on Oct. 26, 2017, now Pat. No. 10,439,588, which is a (Continued)

(30) Foreign Application Priority Data

May 8, 2015 (JP) .................................. 2015-095948

(51) Int. Cl.
*H03H 9/145* (2006.01)
*H03H 9/64* (2006.01)
(Continued)

(52) U.S. Cl.
CPC ...... *H03H 9/1455* (2013.01); *H03H 9/02433* (2013.01); *H03H 9/02818* (2013.01);
(Continued)

(58) Field of Classification Search
CPC ...... H03H 7/09; H03H 9/1455; H03H 9/6483; H03H 9/0557; H03H 9/0542; H03H 9/725;
(Continued)

(56) References Cited

U.S. PATENT DOCUMENTS

2004/0012461 A1* 1/2004 Uriu ..................... H03H 9/0038
333/133
2015/0042417 A1* 2/2015 Onodera ............. H03H 9/6433
333/195

OTHER PUBLICATIONS

Kato et al., "High Frequency Module", U.S. Appl. No. 15/794,073, filed Oct. 26, 2017.

* cited by examiner

*Primary Examiner* — Robert J Pascal
*Assistant Examiner* — Jorge L Salazar, Jr.
(74) *Attorney, Agent, or Firm* — Keating & Bennett, LLP

(57) ABSTRACT

A transmission filter in a high frequency module includes serial arm resonators electrically connected in series to a serial arm electrically connecting a shared terminal and a transmission terminal, parallel arm resonators each electrically connected in series to each of parallel arms electrically connecting the serial arm and a ground, a first inductor electrically connected between the ground and a connection end electrically connecting at least the two parallel arm resonators of the parallel arm resonators, and a second inductor electrically connected between the ground and one parallel arm resonator different from the at least two parallel arm resonators of the parallel arm resonators. The second inductor is electromagnetic field coupled to at least one of an antenna side matching element, a transmission side matching element, and a portion of the serial arm in the transmission filter. The first and second inductors obstruct electromagnetic field coupling therebetween.

18 Claims, 15 Drawing Sheets

Related U.S. Application Data continuation of application No. PCT/JP2016/057913, filed on Mar. 14, 2016.

(51) Int. Cl.
  *H03H 9/02* (2006.01)
  *H03H 9/05* (2006.01)
  *H03H 9/25* (2006.01)
  *H03H 9/72* (2006.01)
  *H03H 7/09* (2006.01)

(52) U.S. Cl.
  CPC ........ *H03H 9/0542* (2013.01); *H03H 9/0557* (2013.01); *H03H 9/14597* (2013.01); *H03H 9/25* (2013.01); *H03H 9/6483* (2013.01); *H03H 9/725* (2013.01); *H03H 7/09* (2013.01)

(58) Field of Classification Search
  CPC .. H03H 9/14597; H03H 9/25; H03H 9/02818; H03H 9/02433
  USPC .......................... 333/133, 187, 188, 193–196
  See application file for complete search history.

←----→ INDUCTIVE COUPLING

HIGH FREQUENCY MODULE

CROSS REFERENCE TO RELATED APPLICATIONS

This application claims the benefit of priority to Japanese Patent Application No. 2015-095948 filed on May 8, 2015 and is a Continuation Application of PCT Application No. PCT/JP2016/057913 filed on Mar. 14, 2016. The entire contents of each application are hereby incorporated herein by reference.

BACKGROUND OF THE INVENTION

1. Field of the Invention

The present invention relates to a high frequency module including a transmission filter and a reception filter.

2. Description of the Related Art

A mobile apparatus or the like for wireless communication includes a transmission filter and a reception filter. The transmission filter passes only a component of a pass band of a transmission signal which is a high frequency signal, and attenuates components other than the component of the pass band. The reception filter passes only a component of a pass band of a reception signal received by an antenna, and attenuates components other than the component of the pass band (for example, see International Publication No. 2015/019722).

A high frequency module disclosed in International Publication No. 2015/019722 includes a transmission filter between a shared terminal electrically connected to an antenna and a transmission terminal. The high frequency module includes a reception filter between the shared terminal and a reception terminal. The transmission filter includes a plurality of serial arm resonators electrically connected in series to a serial arm electrically connecting the shared terminal and the transmission terminal. The transmission filter includes a plurality of parallel arm resonators each electrically connected in series to each of a plurality of parallel arms electrically connecting the serial arm and a ground.

Further, the high frequency module disclosed in International Publication No. 2015/019722 includes an inductor electrically connected between the ground and a connection end electrically connecting two parallel arm resonators of the plurality of parallel arm resonators. In the high frequency module, inductive coupling is generated between the inductor and a matching inductor electrically connected to the shared terminal. It is stated that, in the high frequency module disclosed in International Publication No. 2015/019722, isolation characteristics between the transmission terminal and the reception terminal are improved by an adjustment path defined by the inductive coupling.

Further, the high frequency module disclosed in International Publication No. 2015/019722 includes, in addition to the inductor electrically connected between the ground and the connection end electrically connecting the two parallel arm resonators, an inductor electrically connected between the ground and another parallel arm resonator other than the above two parallel arm resonators. It is stated that this inductor improves attenuation characteristics of the transmission filter.

However, the high frequency module disclosed in International Publication No. 2015/019722 does not take it into consideration to provide both the improvement in isolation characteristics and the improvement in harmonic attenuation characteristics of the transmission filter at the same time. In the high frequency module disclosed in International Publication No. 2015/019722, in the case where, for example, the arrangement or the like of one of the inductors is adjusted in order to adjust the isolation characteristics, the harmonic attenuation characteristics of the transmission filter are affected in some case. In other words, in the high frequency module disclosed in International Publication No. 2015/019722, in the case where inductance of the other one of the inductors is adjusted in order to adjust the harmonic attenuation characteristics of the transmission filter, the isolation characteristics are affected in some case. As such, with the high frequency module disclosed in International Publication No. 2015/019722, it is difficult to provide, at the same time, the improvement in isolation characteristics and the improvement in harmonic attenuation characteristics of the transmission filter.

SUMMARY OF THE INVENTION

Preferred embodiments of the present invention provide high frequency modules that are excellent in isolation characteristics and also excellent in harmonic attenuation characteristics of a transmission filter.

A high frequency module according to a preferred embodiment of the present invention includes a shared terminal electrically connected to an antenna, a transmission terminal, a reception terminal, a transmission filter electrically connected between the shared terminal and the transmission terminal, a reception filter electrically connected between the shared terminal and the reception terminal, and an antenna side matching element electrically connected between the shared terminal and a connection portion of the transmission filter and the reception filter, or a transmission side matching element electrically connected between the transmission terminal and the transmission filter. The transmission filter includes a plurality of serial arm resonators electrically connected in series to a serial arm electrically connecting the shared terminal and the transmission terminal, a plurality of parallel arm resonators each electrically connected in series to each of a plurality of parallel arms electrically connecting the serial arm and a ground, a first inductor electrically connected between the ground and a connection end electrically connecting at least the two parallel arm resonators of the plurality of parallel arm resonators, and a second inductor electrically connected between the ground and one parallel arm resonator different from the at least two parallel arm resonators of the plurality of parallel arm resonators. The second inductor is coupled, by electromagnetic field coupling, to at least one element selected from a group including the antenna side matching element, the transmission side matching element, and a portion of the serial arm in the transmission filter, and the first inductor and the second inductor obstruct electromagnetic field coupling between the first and second inductors.

With the high frequency module of the preferred embodiment of the present invention described above, both isolation characteristics and harmonic attenuation characteristics of the transmission filter are able to be significantly improved at the same time.

To be specific, the first inductor adjusts the harmonic attenuation characteristics of the transmission filter. For example, adjusting inductance of the first inductor causes an attenuation pole of the harmonic to change in the attenuation characteristics of the transmission filter. The inductance of the first inductor is adjusted and the attenuation pole is set at the desired frequency.

In the high frequency module of the preferred embodiment of the present invention described above, the second inductor is coupled, by electromagnetic field coupling, to at least one element selected from the group including the antenna side matching element, the transmission side matching element, and a portion of the serial arm in the transmission filter.

This electromagnetic field coupling defines an adjustment path separate from a main path from the transmission terminal to the shared terminal. By adjusting the mode and strength of the electromagnetic field coupling, a transmission signal flowing to the shared terminal through the transmission filter is canceled out by a transmission signal flowing to the shared terminal through the adjustment path. Specifically, the coupling mode and strength of the electromagnetic field coupling are adjusted and the amplitude of the transmission signal flowing to the shared terminal through the transmission filter and the amplitude of the transmission signal flowing to the shared terminal through the adjustment path become the same or substantially the same, and the phases of the respective transmission signals differ from each other by 180 degrees. The high frequency module is able to provide significantly improved isolation characteristics because the transmission signal that comes around and flowing to the reception terminal is attenuated.

In the high frequency module of the preferred embodiment of the present invention described above, the first inductor and the second inductor obstruct electromagnetic field coupling between the first and second inductors.

Because of this, electromagnetic field coupling between the first inductor and the second inductor is not generated. However, in the preferred embodiment of the present invention described above, the expression "electromagnetic field coupling is not generated" indicates that the design is carried out with the intention of significantly reducing or preventing the generation of electromagnetic field coupling. Accordingly, the expression "electromagnetic field coupling is not generated" does not actually indicate that the electromagnetic field coupling is not generated at all.

In the high frequency module of the preferred embodiment of the present invention described above, because the electromagnetic field coupling between the first inductor and the second inductor is obstructed, the first inductor and the second inductor are able to be separately adjusted without considering influence of the respective inductors. In other words, for example, even if the inductance of the first inductor is adjusted in order to significantly improve the harmonic attenuation characteristics of the transmission filter, the isolation characteristics significantly improved by the electromagnetic field coupling of the second inductor are maintained.

Because the high frequency module includes the first inductor and the second inductor that are not affected each other, both the significant improvement in the isolation characteristics by the second inductor and the significant improvement in the harmonic attenuation characteristics of the transmission filter by the first inductor is able to be provided at the same time.

Note that, in the above description, the second inductor provides the adjustment path to significantly improve the isolation characteristics, while the first inductor is included to adjust the harmonic attenuation characteristics of the transmission filter. However, in the preferred embodiment of the present invention described above, the first inductor in place of the second inductor may be selected to define the adjustment path to significantly improve the isolation characteristics. In other words, the high frequency module of the preferred embodiment of the present invention described above may significantly improve the isolation characteristics by the electromagnetic field coupling of the first inductor and significantly improve the harmonic attenuation characteristics of the transmission filter by the second inductor.

The high frequency module of the preferred embodiment of the present invention described above may include the first inductor coupled, by electromagnetic field coupling, to one element selected from the group including the antenna side matching element, the transmission side matching element, and a portion of the serial arm in the transmission filter.

In the above structure, a second adjustment path that adjusts the isolation characteristics is defined by the first inductor being coupled to another circuit element by electromagnetic field coupling. Accordingly, by adjusting the mode and strength of the electromagnetic field coupling defining the second adjustment path, the isolation characteristics of the high frequency module are further significantly improved.

The high frequency module of the preferred embodiment of the present invention described above may further include a reception side matching element electrically connected between the reception terminal and the reception filter, wherein the high frequency module may include the first inductor coupled, by electromagnetic field coupling, to at least one element selected from a group including the antenna side matching element, the transmission side matching element, the reception side matching element, a portion of the serial arm in the transmission filter, and a reception path from one end to the other end of the reception filter.

The above structure further significantly improves the isolation characteristics of the high frequency module.

A high frequency module according to a preferred embodiment of the present invention includes a shared terminal electrically connected to an antenna, a transmission terminal, a reception terminal, a transmission filter electrically connected between the shared terminal and the transmission terminal, a reception filter electrically connected between the shared terminal and the reception terminal, and an antenna side matching element electrically connected between the shared terminal and a connection portion of the transmission filter and the reception filter, or a transmission side matching element electrically connected between the transmission terminal and the transmission filter. The transmission filter includes a plurality of serial arm resonators electrically connected in series to a serial arm electrically connecting the shared terminal and the transmission terminal, a plurality of parallel arm resonators each electrically connected in series to each of a plurality of parallel arms electrically connecting the serial arm and a ground, a first inductor electrically connected between the ground and a connection end electrically connecting at least the two parallel arm resonators of the plurality of parallel arm resonators, and a second inductor electrically connected between the ground and one parallel arm resonator different from the at least two parallel arm resonators of the plurality of parallel arm resonators. The first inductor is coupled, by electromagnetic field coupling, to at least one element selected from a group including the antenna side matching element, the transmission side matching element, and a portion of the serial arm in the transmission filter, and the first inductor and the second inductor obstruct electromagnetic field coupling between the first and second inductors.

With the high frequency module of the preferred embodiment of the present invention described above, both isolation characteristics and harmonic attenuation characteristics of the transmission filter are able to be significantly improved at the same time.

The high frequency module of the preferred embodiment of the present invention described above may include the second inductor coupled, by electromagnetic field coupling, to one element selected from the group including the antenna side matching element, the transmission side matching element, and a portion of the serial arm in the transmission filter.

In the above structure, a second adjustment path that adjusts the isolation characteristics is defined by the second inductor being coupled to another circuit element by electromagnetic field coupling. Accordingly, by adjusting the mode and strength of the electromagnetic field coupling defining the second adjustment path, the isolation characteristics of the high frequency module are further significantly improved.

The high frequency module of the preferred embodiment of the present invention described above may further include a reception side matching element electrically connected between the reception terminal and the reception filter, wherein the high frequency module may include the second inductor coupled, by electromagnetic field coupling, to at least one element selected from a group including the antenna side matching element, the transmission side matching element, the reception side matching element, a portion of the serial arm in the transmission filter, and a reception path from one end to the other end of the reception filter.

The above structure further significantly improves the isolation characteristics of the high frequency module.

The high frequency module may include circuitry and structure as described below to significantly reduce or prevent the generation of electromagnetic field coupling between the first inductor and the second inductor.

A high frequency module according to a preferred embodiment of the present invention may include a substrate, wherein the transmission filter may be mounted in or on the substrate, and the first inductor and the second inductor may be located at different positions in a plan view of the substrate.

The above structure further significantly improves the isolation characteristics and the harmonic attenuation characteristics of the transmission filter.

In the high frequency module of the preferred embodiment of the present invention described above, one of the first inductor and the second inductor may be provided, as a chip inductor, on a principal surface of the substrate, and the other one of the first inductor and the second inductor may be provided inside the substrate. Also in this case, the first inductor and the second inductor may not overlap with each other in a plan view of the substrate.

The above structure further significantly improves the isolation characteristics and the harmonic attenuation characteristics of the transmission filter.

In the high frequency module of the preferred embodiment of the present invention described above, the first inductor and the second inductor may be arranged with a ground inside the substrate interposed therebetween.

The above structure further significantly improves the isolation characteristics and the harmonic attenuation characteristics of the transmission filter.

According to the preferred embodiments of the present invention, high frequency modules that are excellent in isolation characteristics and also excellent in harmonic attenuation characteristics of a transmission filter are provided.

The above and other elements, features, steps, characteristics, and advantages of the present invention will become more apparent from the following detailed description of preferred embodiments of the present invention with reference to the attached drawings.

DETAILED DESCRIPTION OF THE PREFERRED EMBODIMENTS

Figure 1:
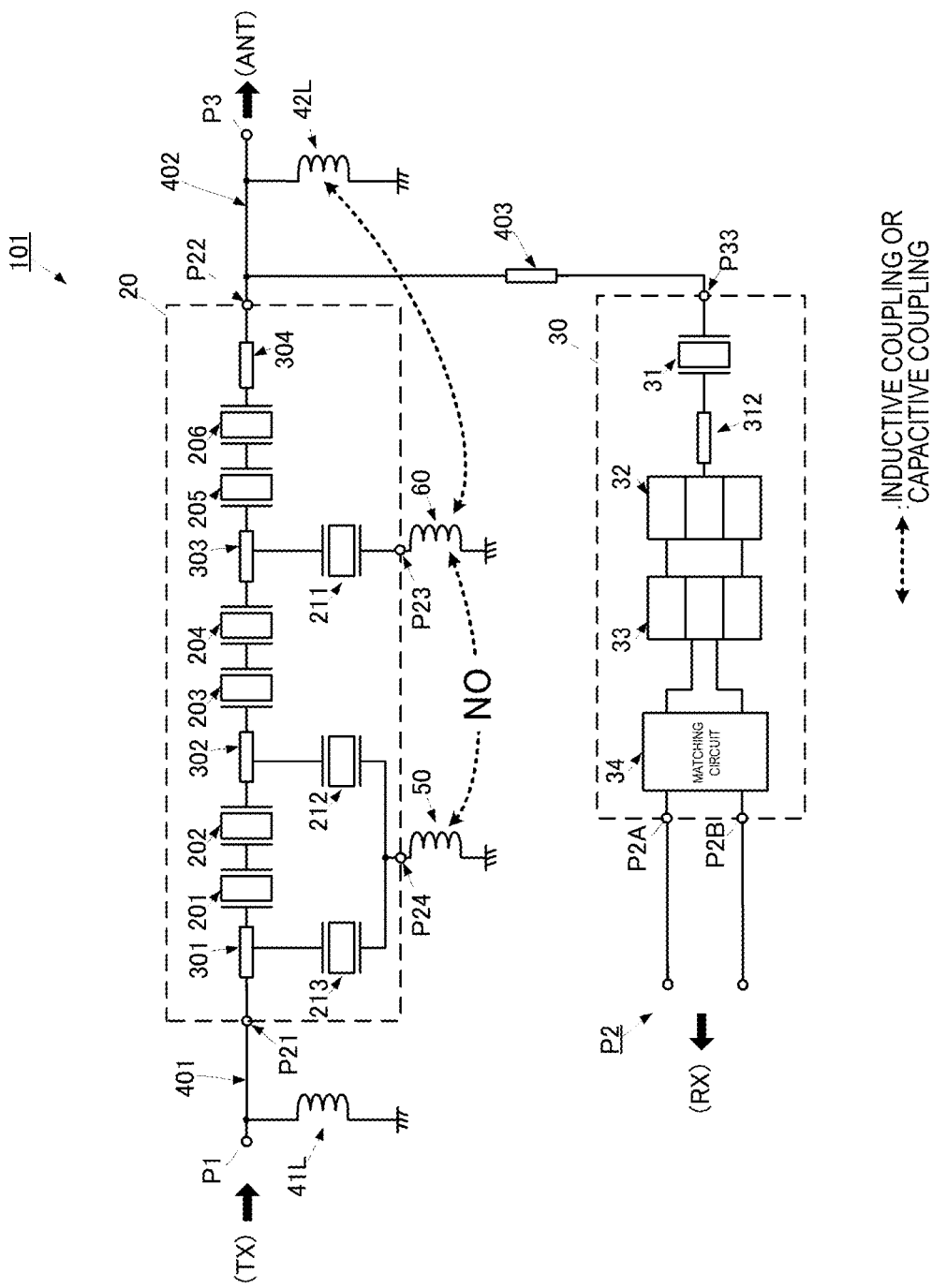
FIG. 1 is a circuit block diagram showing a first circuit example of a high frequency module according to a preferred embodiment of the present invention.

Preferred embodiments of the present invention will be described with reference to FIGS. 1 to 16. Note that the following description is in all aspects illustrative and not restrictive and should not be construed to restrict the applications or implementations of the preferred embodiments of the present invention in any manner. High frequency modules according to preferred embodiments of the present invention will be described with reference to the drawings. In the following, the description is provided with respect to a duplexer as an example of a high frequency module. In the specification, "electromagnetic field coupling" refers to electric field coupling, magnetic field coupling, or both of them. In the drawings, "NO" indicates that electromagnetic field coupling is not generated between circuits.

Figure 2:
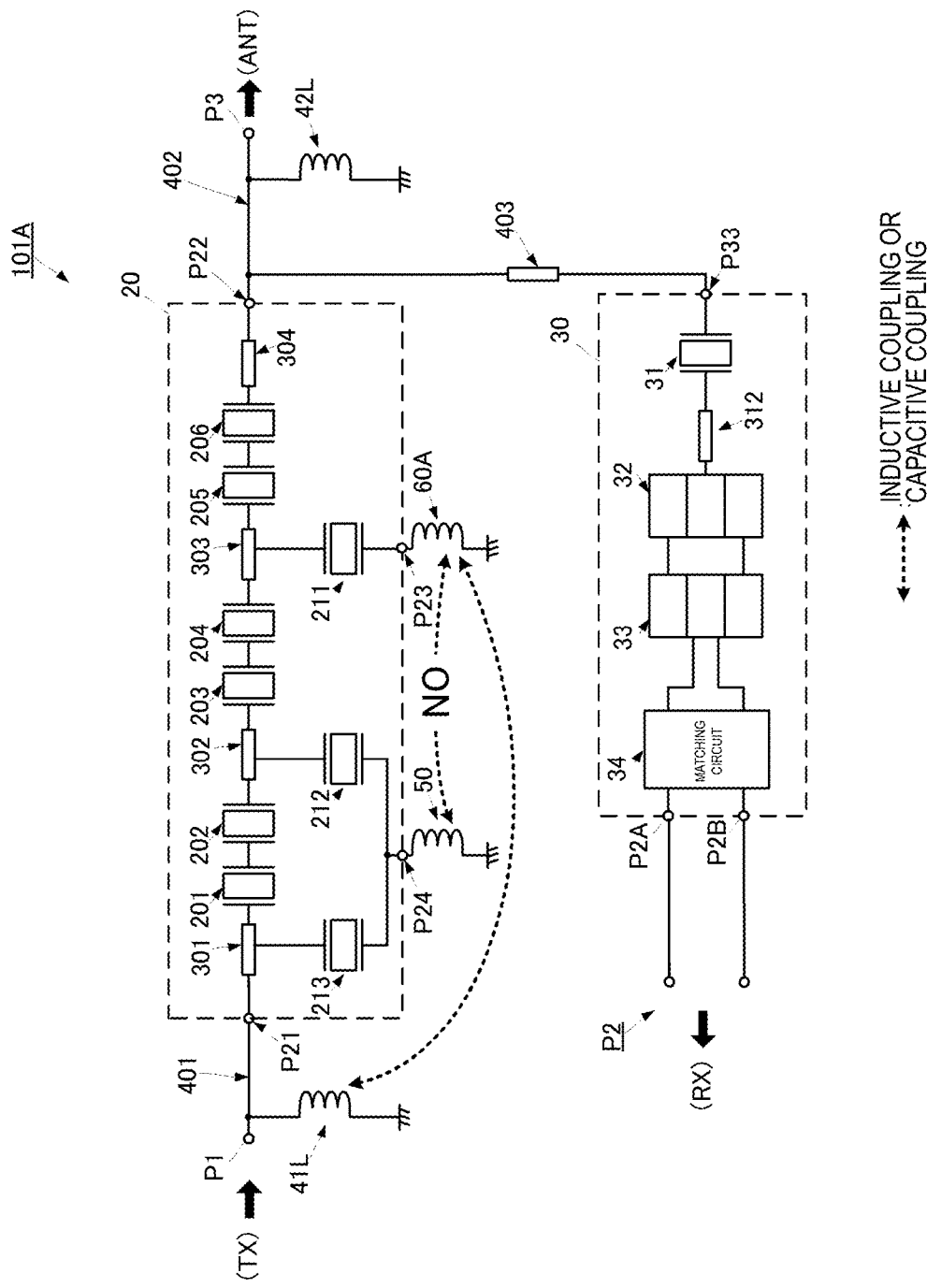
FIG. 2 is a circuit block diagram showing a second circuit example of a high frequency module according to a preferred embodiment of the present invention.
Figure 3:
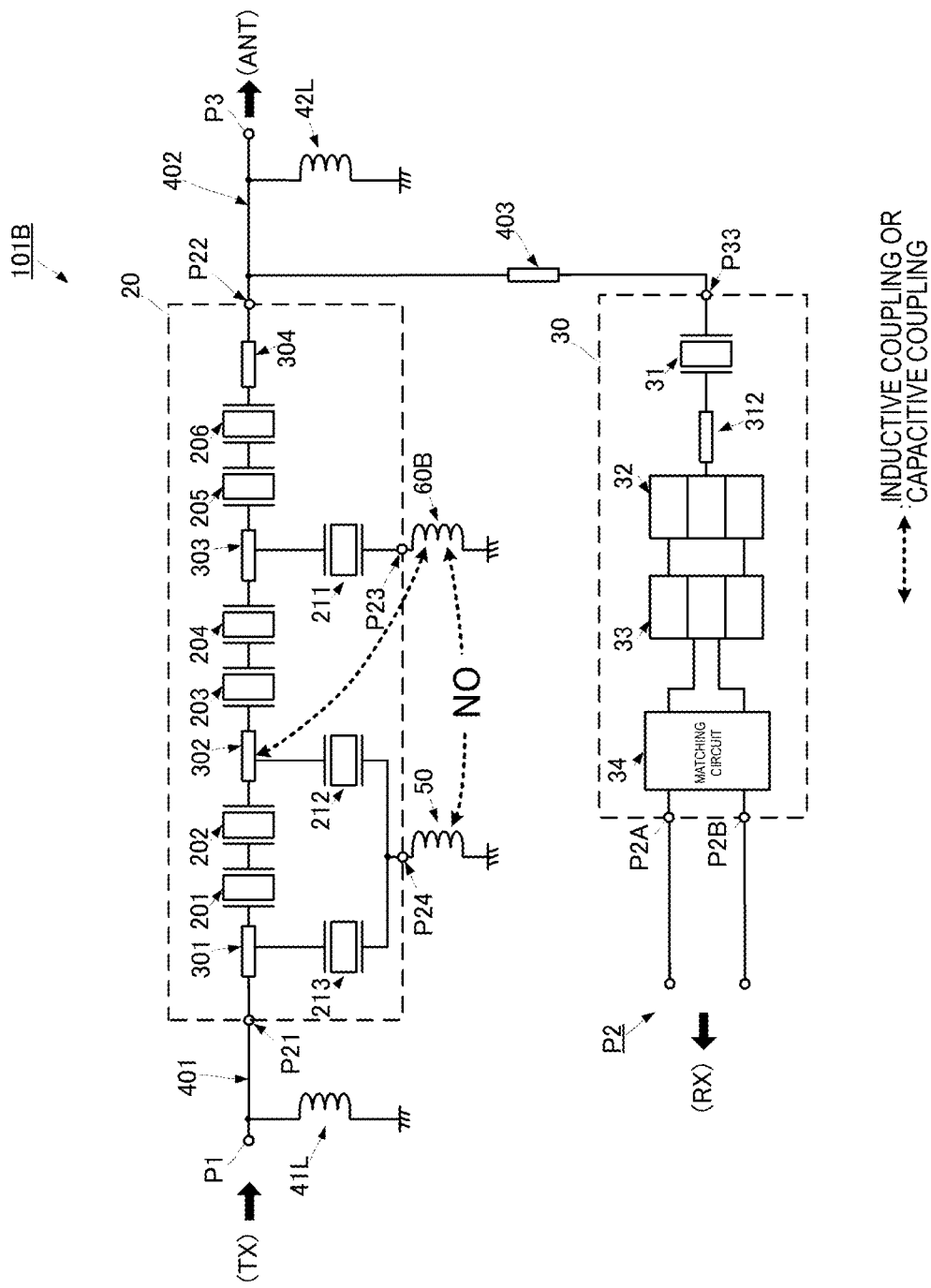
FIG. 3 is a circuit block diagram showing a third circuit example of a high frequency module according to a preferred embodiment of the present invention.
Figure 4:
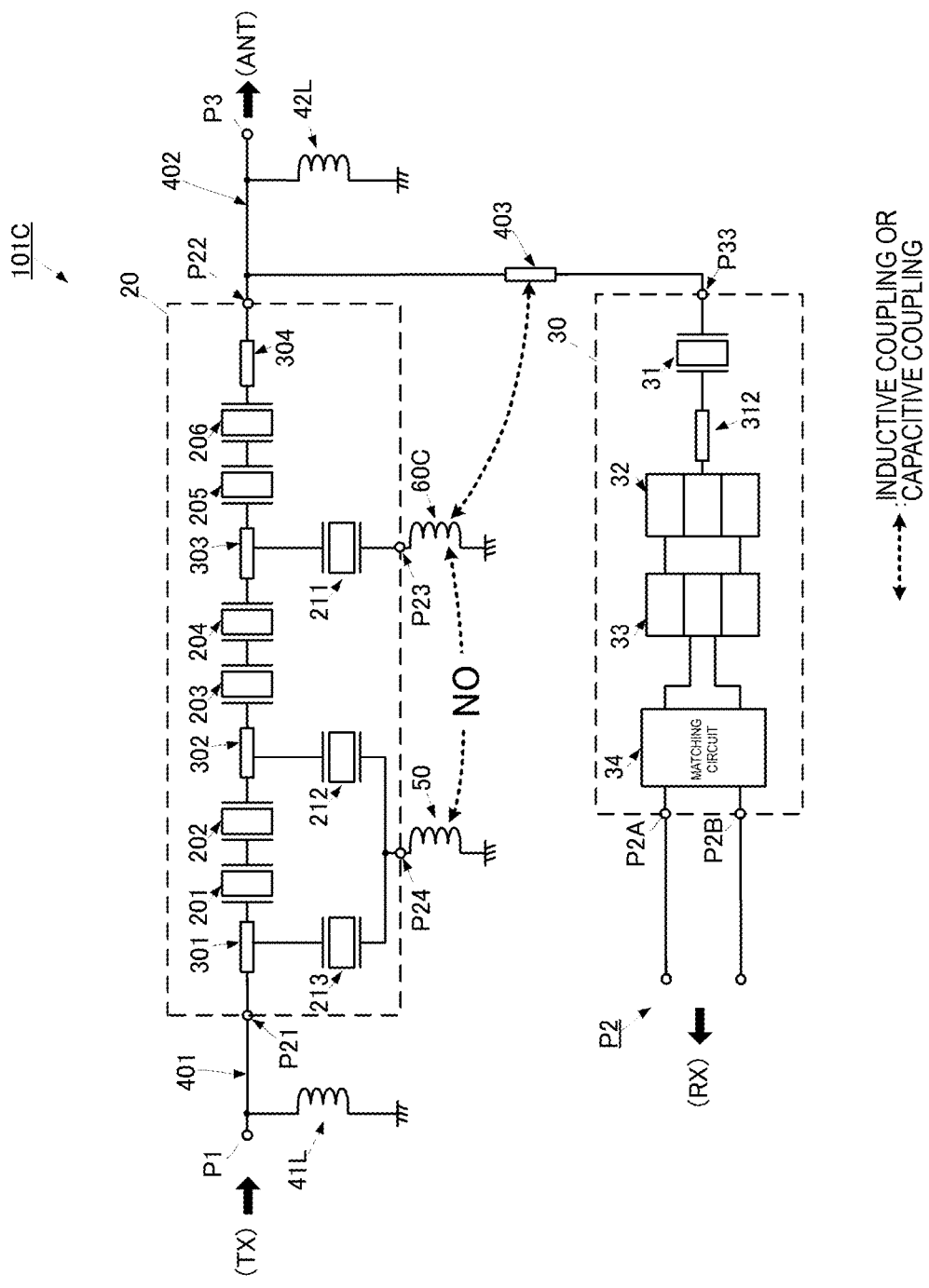
FIG. 4 is a circuit block diagram showing a fourth circuit example of a high frequency module according to a preferred embodiment of the present invention.
Figure 5:
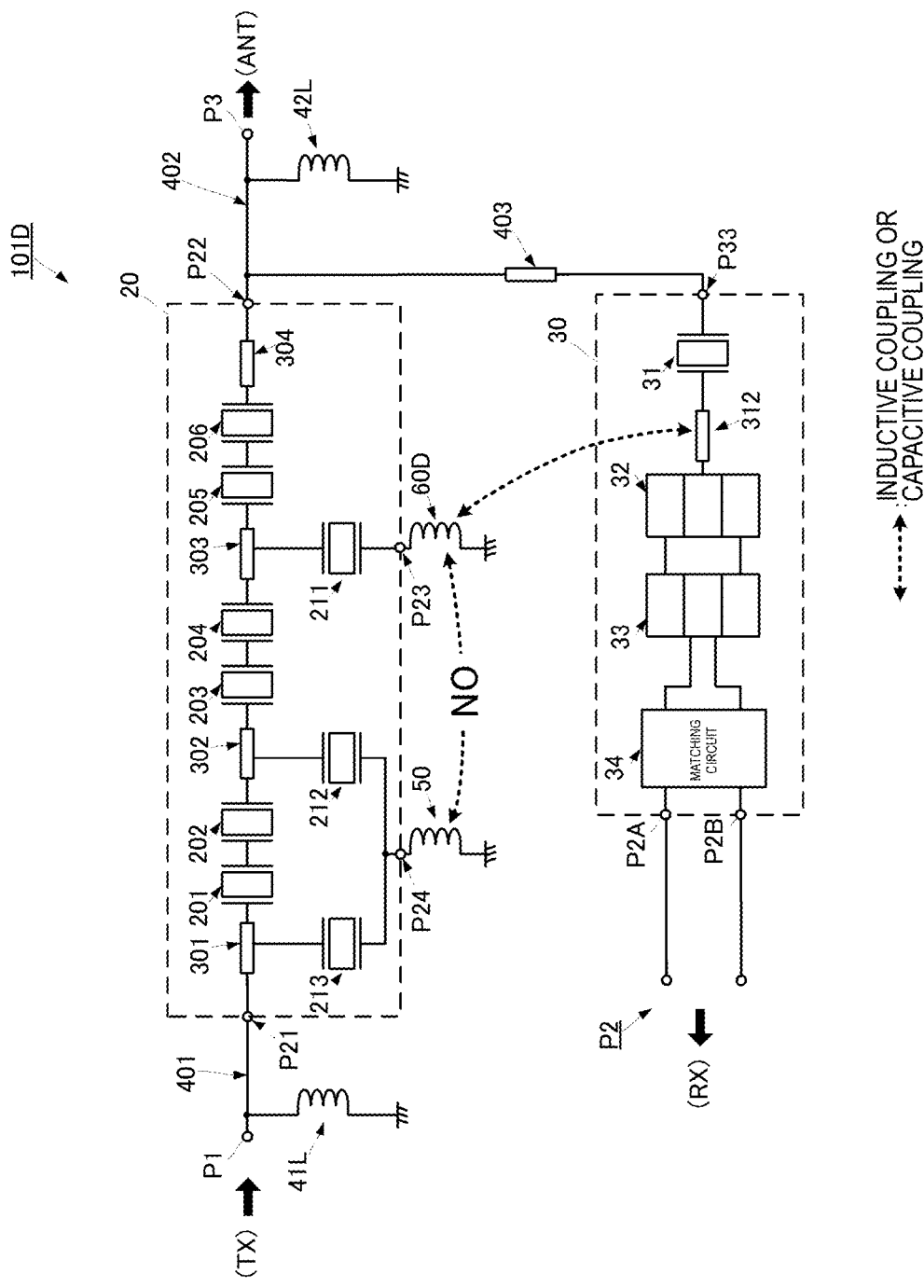
FIG. 5 is a circuit block diagram showing a fifth circuit example of a high frequency module according to a preferred embodiment of the present invention.
Figure 6:
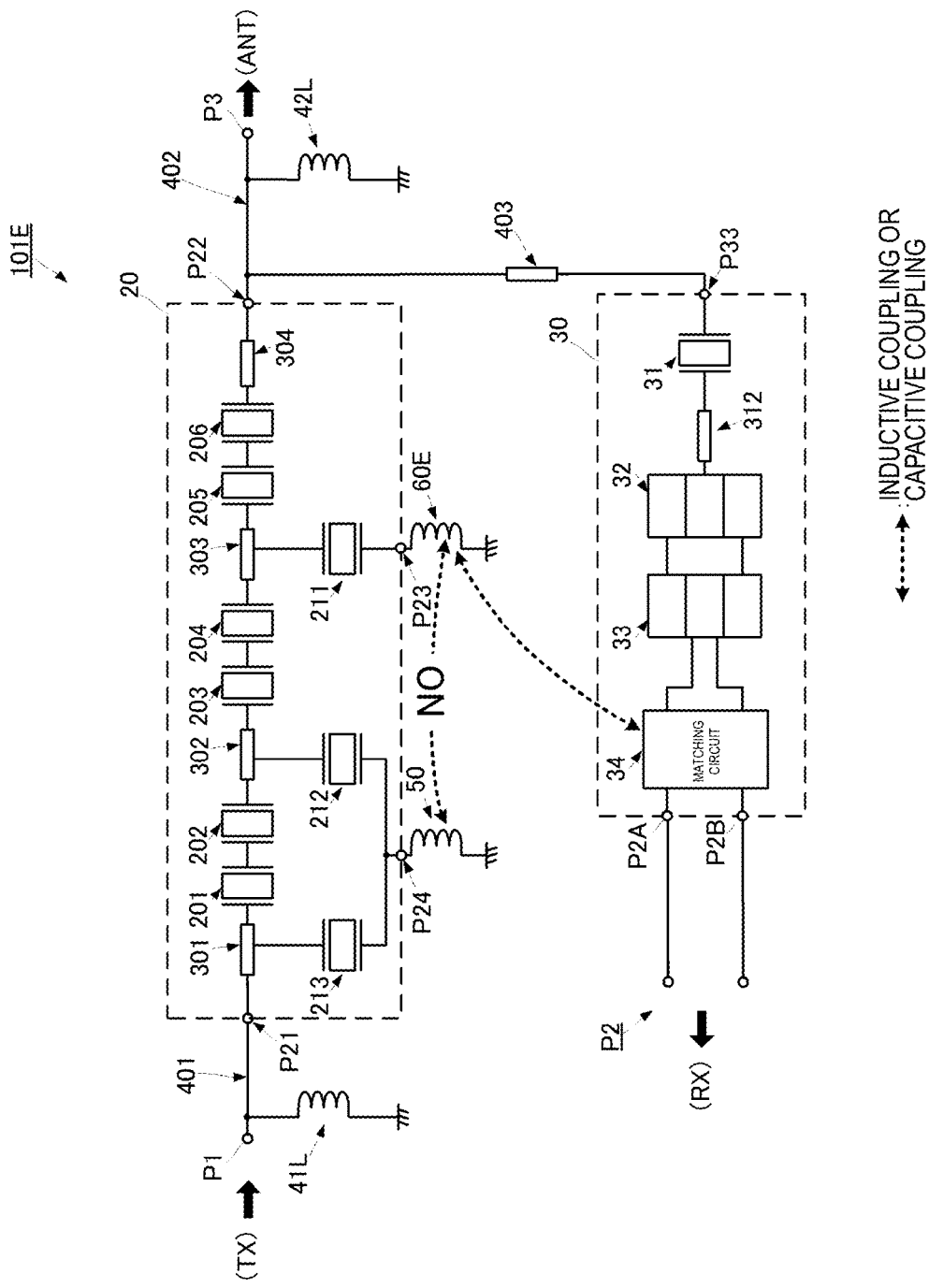
FIG. 6 is a circuit block diagram showing a sixth circuit example of a high frequency module according to a preferred embodiment of the present invention.

FIG. 1 is a circuit block diagram of a duplexer 101 of a first circuit example. FIG. 2 is a circuit block diagram of a duplexer 101A of a second circuit example. FIG. 3 is a circuit block diagram of a duplexer 101B of a third circuit example. FIG. 4 is a circuit block diagram of a duplexer 101C of a fourth circuit example. FIG. 5 is a circuit block diagram of a duplexer 101D of a fifth circuit example. FIG. 6 is a circuit block diagram of a duplexer 101E of a sixth circuit example. Note that in FIGS. 1 to 6, in order to significantly improve the visibility of the drawings, representative examples of inductive coupling or capacitive coupling are shown.

First, a circuit common to the duplexers 101, 101A, 101B, 101C, 101D, and 101E respectively shown in FIGS. 1 to 6 will be described. In the following, the duplexers 101, 101A, 101B, 101C, 101D, and 101E are collectively referred to as duplexers 101-101E.

The duplexers 101-101E each include a first external connection terminal P1, a second external connection terminal P2, a third external connection terminal P3, a transmission signal filter 20, a reception signal filter 30, an inductor 41L, an inductor 42L, an inductor 50, and an inductor 60.

The transmission signal filter 20 is electrically connected between the first external connection terminal P1 and the third external connection terminal P3. The reception signal filter 30 is electrically connected between the second external connection terminal P2 and the third external connection terminal P3. The inductor 41L is a matching element, and is shunt-electrically connected to a path 401 between the first external connection terminal P1 and the transmission signal filter 20. The inductor 42L is a matching element, and is shunt-electrically connected to a path 402 between the third external connection terminal P3 and the transmission signal filter 20.

The transmission signal filter 20 includes a series connection terminal P21, a series connection terminal P22, a shunt connection terminal P23, and a shunt connection terminal P24. The series connection terminal P21 is electrically connected to the first external connection terminal Pb. The series connection terminal P22 is electrically connected to the third external connection terminal P3.

The shunt connection terminal P23 is electrically connected to the ground with the inductor 60 interposed therebetween. The shunt connection terminal P24 is electrically connected to the ground with the inductor 50 interposed therebetween. The inductor 60 corresponds to a second inductor, and the inductor 50 corresponds to a first inductor.

In the present application, the shunt connection refers to a connection between a path and the ground. Further, the series connection refers to a connection in series between circuits.

The transmission signal filter 20 includes a plurality of SAW resonators 201, 202, 203, 204, 205, and 206 (hereinafter, referred to as SAW resonators 201-206 when these SAW resonators are collectively explained). The transmission signal filter 20 further includes a plurality of SAW resonators 211, 212, and 213. The SAW resonators 201-206 correspond to serial arm resonators, and the SAW resonators 211, 212, and 213 respectively correspond to parallel arm resonators.

The SAW resonators 201-206 are electrically connected in series between the series connection terminal P21 and the series connection terminal P22. In other words, the SAW resonators 201-206 are electrically connected in series to a serial arm electrically connecting the first external connection terminal P1 and the third external connection terminal P3. To be specific, one end of the SAW resonator 201 is electrically connected to the series connection terminal P21 with a connection conductor 301 interposed therebetween while the other end thereof is electrically connected to one end of the SAW resonator 202. The other end of the SAW resonator 202 is electrically connected to one end of the SAW resonator 203 with a connection conductor 302 interposed therebetween. The other end of the SAW resonator 203 is electrically connected to one end of the SAW resonator 204. The other end of the SAW resonator 204 is electrically connected to one end of the SAW resonator 205 with a connection conductor 303 interposed therebetween. The other end of the SAW resonator 205 is electrically connected to one end of the SAW resonator 206. The other end of the SAW resonator 206 is electrically connected to the series connection terminal P22 with a connection conductor 304 interposed therebetween.

The SAW resonators 211, 212, and 213 are respectively electrically connected to a plurality of parallel arms electrically connecting the ground and the serial arm between the first external connection terminal P1 and the third external connection terminal P3. To be specific, one end of the SAW resonator 213 is electrically connected to the connection conductor 301 while the other end thereof is electrically connected to the shunt connection terminal P24. One end of the SAW resonator 212 is electrically connected to the connection conductor 302 while the other end thereof is electrically connected to the shunt connection terminal P24. In other words, the shunt connection terminal P24 is a terminal common to the SAW resonators 212 and 213, and collects and electrically connects the other ends of the SAW resonators 212 and 213 to the ground. One end of the SAW resonator 211 is electrically connected to the connection conductor 303 while the other end thereof is electrically connected to the shunt connection terminal P23.

The SAW resonators 201-206, 211, 212, and 213 respectively provide resonant frequencies. With the above-discussed circuitry and structure, the transmission signal filter 20 defines a ladder connection filter and provides the desired bandpass characteristics and attenuation characteristics as the transmission signal filter 20 by combining the SAW resonators 201-206, 211, 212, and 213. In the transmission signal filter 20, the number of SAW resonators, the arrangement thereof, or the like may be appropriately changed to provide the frequency band of a signal to be passed and the desired attenuation characteristics.

The reception signal filter 30 includes a series connection terminal P33, a SAW resonator 31, a longitudinally coupled SAW resonator 32, a longitudinally coupled SAW resonator 33, a matching circuit 34, and balanced connection terminals P2A and P2B.

The series connection terminal P33 is electrically connected to the third external connection terminal P3 with a connection conductor 403 interposed therebetween. One end of the SAW resonator 31 is electrically connected to the series connection terminal P33 while the other end thereof is electrically connected to one end of the SAW resonator 32 with a connection conductor 312 interposed therebetween. The longitudinally coupled SAW resonator 32 provides a balanced-unbalanced transforming feature. The other end of the SAW resonator 32 is electrically connected to one end of the SAW resonator 33 in a balanced arrangement. The other end of the SAW resonator 33 is electrically connected to one end of the matching circuit 34. The matching circuit 34 includes an inductor and a capacitor. The other end of the matching circuit 34 is electrically connected to the balanced connection terminals P2A and P2B. The balanced connection terminals P2A and P2B are electrically connected to the second external connection terminal P2 as a balanced terminal. Note that, however, it is not necessary for the circuitry and structure of the reception signal filter 30 to provide the balanced-unbalanced transforming feature in the present preferred embodiment. Accordingly, the second external connection terminal P2 and the balanced connection terminals P2A, P2B of the reception signal filter 30 may respectively be unbalanced terminals.

As described below, in the duplexers 101-101E according to the present preferred embodiment, the inductor 50 and the inductor 60 obstruct electromagnetic field coupling between the inductors 50 and 60. Because of this, electromagnetic field coupling between the inductor 50 and the inductor 60 is not generated. However, in the present preferred embodiment, the expression "electromagnetic field coupling is not generated" or "electromagnetic field coupling is obstructed" indicates that the design is carried out with the intention of significantly reducing or preventing the generation of electromagnetic field coupling. Accordingly, the expression "electromagnetic field coupling is not generated" or "electromagnetic field coupling is obstructed" does not actually indicate that the electromagnetic field coupling is not generated at all.

By significantly reducing or preventing the generation of electromagnetic field coupling between the inductor 50 and the inductor 60, the inductance of the inductors 50 and 60 is able to be adjusted separately without the inductors 50 and 60 being affected each other. As a result, isolation characteristics of the duplexers 101-101E and harmonic attenuation characteristics of the transmission signal filter 20 are able to be both significantly improved. Accordingly, with the inductor 50 (first inductor) and the inductor 60 (second inductor) that are not affected each other, both the significant improvement in the isolation characteristics of the duplexers 101-101E and the significant improvement in the harmonic attenuation characteristics of the transmission signal filter 20 are able to be provided at the same time.

First Circuit Example

In the duplexer 101 as shown in FIG. 1, the inductor 50 and the inductor 60 obstruct electromagnetic field coupling between the inductors 50 and 60. For example, a ground is located between the inductor 60 and the inductor 50, or the inductor 60 and the inductor 50 are spaced with a distance therebetween longer than a distance between the inductor 60 and the inductor 42L. This significantly reduces or prevents the generation of electromagnetic field coupling between the inductor 50 and the inductor 60, and thus the inductor 60 and the inductor 50 are able to be separately adjusted.

The inductor 60, which is not coupled to the inductor 50 by electromagnetic field coupling, and the inductor 42L include electromagnetic field coupling (capacitive coupling or inductive coupling) generated therebetween. With this electromagnetic field coupling, an adjustment path that adjusts the isolation characteristics is defined. The adjustment path includes the connection conductor 303, the SAW resonator 211, the shunt connection terminal P23, the inductor 60, and the inductor 42L.

The coupling mode and strength of the electromagnetic field coupling that defines the adjustment path are adjusted, and a transmission signal that passes through the transmission signal filter 20 and the path 402 from the first external connection terminal P1 and a transmission signal that passes through the adjustment path are canceled out at the third external connection terminal P3. Specifically, the mode and strength of the electromagnetic field coupling between the inductor 60 and the inductor 42L are adjusted, and at the third external connection terminal P3, the amplitudes of the transmission signal passing through the transmission signal filter 20 and the path 402 from the first external connection terminal P1 and the transmission signal passing through the adjustment path are the same or substantially the same, and the phases of the respective transmission signals are different from each other by 180 degrees. The mode of electromagnetic field coupling includes the inductive coupling between the inductor 60 and the inductor 42L and the capacitive coupling between the conductors defining the inductor 60 and the inductor 42L. The strength of the electromagnetic field coupling is determined in accordance with the distance between the inductor 60 and the inductor 42L, for example. By adjusting the mode and strength of the electromagnetic field coupling, the transmission signal passing through the transmission signal filter 20 and the path 402 from the first external connection terminal P1 is canceled out by the transmission signal flowing through the adjustment path, thus increasing attenuation of the transmission signal in the transmission path. As a result, since the transmission signal is also attenuated at the second external connection terminal P2, isolation characteristics between transmission and reception of the duplexer 101 are significantly improved.

The inductance of the inductor 50, which is not coupled to the inductor 60 by electromagnetic coupling, is adjusted and the harmonic attenuation characteristics of the transmission signal filter 20 provide the desired characteristics at the third external connection terminal P3. The change in the inductance of the inductor 50 causes the attenuation pole of a harmonic region in the attenuation characteristics of the transmission signal filter 20 to change. The inductance of the inductor 50 is set to provide the attenuation pole at the desired frequency in the attenuation characteristics of the transmission signal filter 20.

A harmonic frequency of the transmission signal or the like is able to be provided, for example, as the desired frequency attenuated by the attenuation pole set by the change of the inductance of the inductor 50, which is not coupled to the inductor 60 by electromagnetic field coupling. As the harmonic of the transmission signal, a second-order harmonic, a third-order harmonic, or the like of the transmission signal is able to be provided.

In the duplexer 101 as shown in FIG. 1, the inductor 50 and the inductor 60 is able to be separately adjusted because electromagnetic field coupling between the inductor 50 and the inductor 60 is significantly reduced or prevented from being generated. As such, even if the inductance of the inductor 50 is adjusted, the isolation characteristics of the duplexer 101 are not affected by the adjustment. Likewise, even if the mode and strength of the electromagnetic field coupling between the inductor 60 and the inductor 42L are adjusted, the harmonic attenuation characteristics of the transmission signal filter 20 are not affected. As a result, the duplexer 101 is able to significantly improve the isolation characteristics between the transmission and reception and significantly improve the harmonic attenuation characteristics of the transmission signal filter 20 at the same time.

Second Circuit Example

The duplexer 101A shown in FIG. 2 differs from the duplexer 101 shown in FIG. 1 in the following point. In the duplexer 101A, by the generation of electromagnetic field coupling between an inductor 60A and the inductor 41L, an adjustment path is provided, thus significantly improving isolation characteristics between the transmission and reception. That is, in the present example, the adjustment path that significantly improves the isolation characteristics includes the inductor 41L, the inductor 60A, the shunt connection terminal P23, the SAW resonator 211, and the connection conductor 303.

As shown in FIG. 2, the inductor 60A and the inductor 50 obstruct electromagnetic field coupling between the inductors 60A and 50, also in the duplexer 101A. For example, a ground is located between the inductor 60A and the inductor 50, or the inductor 60A and the inductor 50 are spaced by a distance therebetween longer than a distance between the inductor 60A and the inductor 41L. Accordingly, the inductor 60A and the inductor 50 are able to be adjusted separately.

As such, even if the inductance of the inductor 50 is adjusted, the isolation characteristics of the duplexer 101A are not affected by the adjustment. Likewise, even if the mode and strength of the electromagnetic field coupling between the inductor 60A and the inductor 41L are adjusted, the harmonic attenuation characteristics of the transmission signal filter 20 are not affected. As a result, the duplexer 101A is able to significantly improve the isolation characteristics between the transmission and reception and significantly improve the harmonic attenuation characteristics of the transmission signal filter 20 at the same time.

Third Circuit Example

The duplexer 101B shown in FIG. 3 differs from the duplexer 101 shown in FIG. 1 in the following point. In the duplexer 101B, by the generation of electromagnetic field coupling between an inductor 60B and the connection conductor 302, an adjustment path is provided, thus significantly improving isolation characteristics between the transmission and reception. That is, in the present example, the adjustment path that significantly improves the isolation characteristics includes the connection conductor 302, the inductor 60B, the shunt connection terminal P23, the SAW resonator 211, and the connection conductor 303.

As shown in FIG. 3, the inductor 60B and the inductor 50 obstruct electromagnetic field coupling between the inductors 60B and 50, also in the duplexer 101B. For example, a ground is located between the inductor 60B and the inductor 50, or the inductor 60B and the inductor 50 are spaced by a distance therebetween longer than a distance between the inductor 60B and the connection conductor 302. Accordingly, the inductor 60B and the inductor 50 are able to be adjusted separately.

As such, even if the inductance of the inductor 50 is adjusted, the isolation characteristics of the duplexer 101B are not affected by the adjustment. Likewise, even if the mode and strength of the electromagnetic field coupling between the inductor 60B and the connection conductor 302 are adjusted, the harmonic attenuation characteristics of the transmission signal filter 20 are not affected. As a result, the duplexer 101B is able to significantly improve the isolation characteristics between the transmission and reception and significantly improve the harmonic attenuation characteristics of the transmission signal filter 20 at the same time.

The third circuit example may be in a mode in which an adjustment path is provided by the generation of electromagnetic field coupling between the inductor 60B and the connection conductor 301, between the inductor 60B and the connection conductor 303, or between the inductor 60B and the connection conductor 304.

Fourth Circuit Example

The duplexer 101C shown in FIG. 4 differs from the duplexer 101 shown in FIG. 1 in the following point. In the duplexer 101C, by the generation of electromagnetic field coupling between an inductor 60C and the connection conductor 403, an adjustment path is provided, thus significantly improving isolation characteristics between the transmission and reception. That is, in the present example, the adjustment path that significantly improves the isolation characteristics includes the connection conductor 403, the inductor 60C, the shunt connection terminal P23, the SAW resonator 211, and the connection conductor 303.

As shown in FIG. 4, the inductor 60C and the inductor 50 obstruct electromagnetic field coupling therebetween also in the duplexer 101C. For example, a ground is located between the inductor 60C and the inductor 50, or the inductor 60C and the inductor 50 are spaced by a distance therebetween longer than a distance between the inductor 60C and the connection conductor 403. Accordingly, the inductor 60C and the inductor 50 are able to be adjusted separately.

As such, even if the inductance of the inductor 50 is adjusted, the isolation characteristics of the duplexer 101C are not affected by the adjustment. Likewise, even if the mode and strength of the electromagnetic field coupling between the inductor 60C and the connection conductor 403 are adjusted, the harmonic attenuation characteristics of the transmission signal filter 20 are not affected. As a result, the duplexer 101C is able to significantly improve the isolation characteristics between the transmission and reception and significantly improve the harmonic attenuation characteristics of the transmission signal filter 20 at the same time.

Fifth Circuit Example

The duplexer 101D shown in FIG. 5 differs from the duplexer 101 shown in FIG. 1 in the following point. In the duplexer 101D, by the generation of electromagnetic field coupling between an inductor 60D and the connection conductor 312 in the reception signal filter 30, an adjustment path is provided, thus significantly improving isolation characteristics between the transmission and reception. That is, in the present example, the adjustment path that significantly improves the isolation characteristics includes the connection conductor 312, the inductor 60D, the shunt connection terminal P23, the SAW resonator 211, and the connection conductor 303.

As shown in FIG. 5, the inductor 60D and the inductor 50 obstruct electromagnetic field coupling between the inductors 60D and 50, also in the duplexer 101D. For example, a ground is located between the inductor 60D and the inductor 50. Alternatively, the inductor 60D and the inductor 50 are spaced by a distance therebetween longer than a distance between the inductor 60D and the connection conductor 312. Accordingly, the inductor 60D and the inductor 50 are able to be adjusted separately.

As such, even if the inductance of the inductor 50 is adjusted, the isolation characteristics of the duplexer 101D are not affected by the adjustment. Likewise, even if the mode and strength of the electromagnetic field coupling between the inductor 60D and the connection conductor 312 are adjusted, the harmonic attenuation characteristics of the transmission signal filter 20 are not affected. As a result, the duplexer 101D is able to significantly improve the isolation characteristics between the transmission and reception and significantly improve the harmonic attenuation characteristics of the transmission signal filter 20 at the same time.

Sixth Circuit Example

The duplexer 101E shown in FIG. 6 differs from the duplexer 101 shown in FIG. 1 in the following point. In the duplexer 101E, by the generation of electromagnetic field coupling between an inductor 60E and the matching circuit 34 in the reception signal filter 30, an adjustment path is provided, thus significantly improving isolation characteristics between the transmission and reception. That is, in the present example, the adjustment path that adjusts the attenuation of a transmission signal to significantly improve the isolation characteristics includes the matching circuit 34, the inductor 60E, the shunt connection terminal P23, the SAW resonator 211, and the connection conductor 303.

As shown in FIG. 6, also in the duplexer 101E, to obstruct electromagnetic field coupling between the inductors 60E and 50, a ground is located between the inductor 60E and the inductor 50, or the inductor 60E and the inductor 50 are spaced by a distance therebetween longer than a distance between the inductor 60E and the matching circuit 34 in the filter 30. Accordingly, the inductor 60E and the inductor 50 are able to be adjusted separately.

As such, even if the inductance of the inductor 50 is adjusted, the isolation characteristics of the duplexer 101E are not affected by the adjustment. Likewise, even if the mode and strength of the electromagnetic field coupling between the inductor 60E and the matching circuit 34 are adjusted, the harmonic attenuation characteristics of the transmission signal filter 20 are not affected. As a result, the duplexer 101E is able to significantly improve the isolation characteristics between the transmission and reception and significantly improve the harmonic attenuation characteristics of the transmission signal filter 20 at the same time.

Although, in the above-discussed examples, electromagnetic field coupling is generated between each of the inductors 60 to 60E and one circuit element, electromagnetic field coupling may be generated between each of the inductors 60 to 60E and two or more circuit elements. In other words, the duplexers 101-101E may include a plurality of adjustment paths through the inductors 60 to 60E.

Further, in the above examples, at least one circuit element and one of the inductors 60 to 60E are coupled by electromagnetic field coupling, and thus the above one of the inductors 60 to 60E defines an adjustment path and consequently the isolation characteristics between the transmission and reception are significantly improved. The harmonic attenuation characteristics of the transmission signal filter 20 are significantly improved by the inductor 50, which is not coupled by electromagnetic field coupling to any of the inductors 60 to 60E. As discussed below, as an inductor that is coupled, by electromagnetic field coupling, to at least one circuit element to define an adjustment path that significantly improves the isolation characteristics, the inductor 50 may be selected in place of the inductors 60 to 60E.

Seventh Circuit Example

Figure 7:
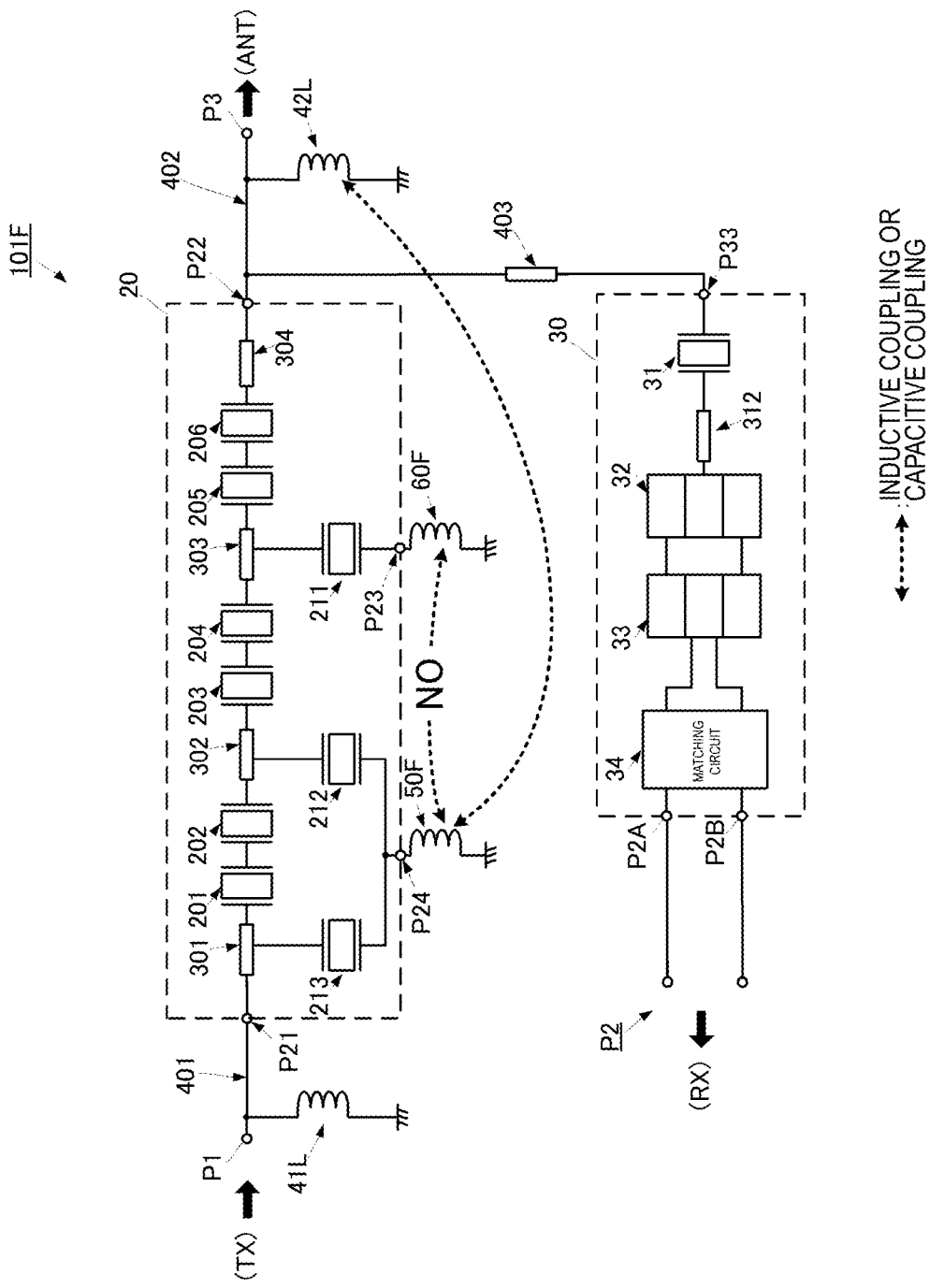
FIG. 7 is a circuit block diagram showing a seventh circuit example of a high frequency module according to a preferred embodiment of the present invention.

FIG. 7 is a circuit block diagram of a duplexer 101F of a seventh circuit example. As shown in FIG. 7, in the duplexer 101F, by the generation of electromagnetic field coupling between an inductor 50F and the inductor 42L, an adjustment path is provided. Electromagnetic field coupling between an inductor 60F and the inductor 50F is obstructed.

In other words, by the generation of the electromagnetic field coupling between the inductor 50F and the inductor 42L, the above-mentioned adjustment path is provided, thus significantly improving the isolation characteristics between the transmission and reception of the duplexer 101F. In the duplexer 101F, the inductor 60F is included to adjust the harmonic attenuation characteristics of the transmission signal filter 20.

The inductor 60F and the inductor 50F obstruct electromagnetic field coupling between the inductors 60F and 50F also in the duplexer 101F of the seventh circuit example. For example, a ground is located between the inductor 60F and the inductor 50F. Alternatively, the inductor 60F and the inductor 50F are spaced by a distance therebetween longer than a distance between the inductor 50F and the inductor 42L. Accordingly, the inductor 60F and the inductor 50F are able to be adjusted separately.

As such, even if the inductance of the inductor 60F is adjusted, the isolation characteristics of the duplexer 101F are not affected by the adjustment. Likewise, even if the mode and strength of the electromagnetic field coupling between the inductor 50F and the inductor 42L are adjusted, the harmonic attenuation characteristics of the transmission signal filter 20 are not affected. As a result, the duplexer 101F is able to significantly improve the isolation characteristics between the transmission and reception and significantly improve the harmonic attenuation characteristics of the transmission signal filter 20 at the same time.

Although not shown, an adjustment path that significantly improves the isolation characteristics is not limited to the example in which the adjustment path is provided by the electromagnetic field coupling generated between the inductor 50F and the inductor 42L. The adjustment path may be defined by the generation of electromagnetic field coupling between the inductor 50F and at least one element selected from a group including the inductors 41L and 42L, the connection conductors 301 to 304, the connection conductor 403, the connection conductor 312, and the matching circuit 34.

Eighth Circuit Example

Figure 8:
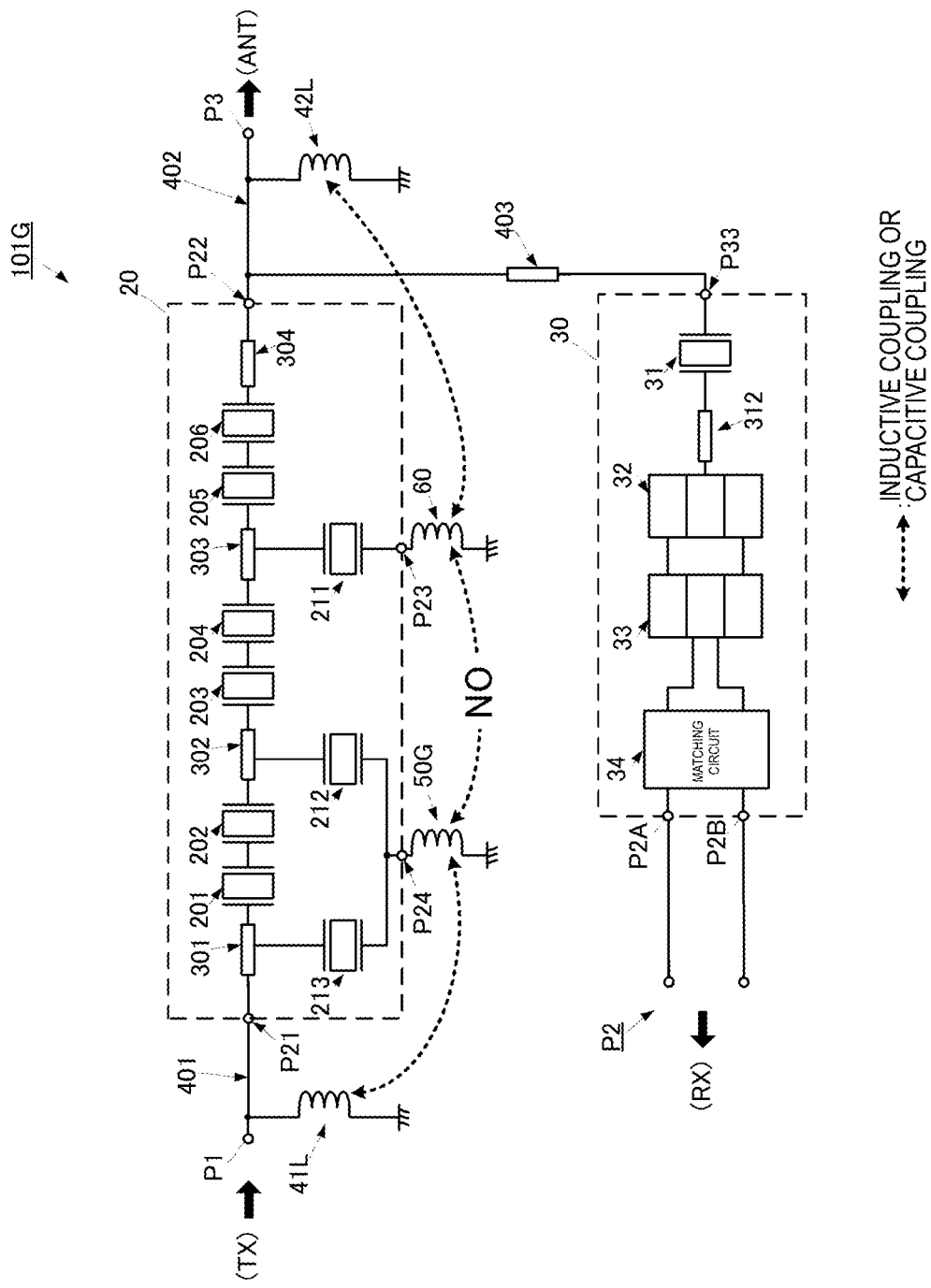
FIG. 8 is a circuit block diagram showing an eighth circuit example of a high frequency module according to a preferred embodiment of the present invention.

FIG. 8 is a circuit block diagram of a duplexer 101G of an eighth circuit example. In the duplexer 101G, electromagnetic field coupling is also generated between an inductor 50G and the inductor 41L. That is, in the eighth circuit example, the electromagnetic field coupling is generated between the inductor 50G and the inductor 41L, which is not coupled to the inductor 60 by electromagnetic field coupling.

The inductor 60 and the inductor 50G obstruct electromagnetic field coupling between the inductors 60 and 50G also in the duplexer 101G. For example, a ground is located between the inductor 60 and the inductor 50G. Alternatively, the inductor 60 and the inductor 50G are spaced by a distance therebetween longer than a distance between the inductor 60 and the inductor 42L and/or a distance between the inductor 50G and the inductor 41L. Accordingly, the inductor 60 and the inductor 50G are able to be adjusted separately.

In the present example, an adjustment path is further provided by the electromagnetic field coupling generated between the inductor 50G and the inductor 41L. The isolation characteristic are significantly improved by adjusting the mode and strength of the electromagnetic field coupling generated between the inductor 50G and the inductor 41L. In other words, in the eighth circuit example, the isolation characteristics are further significantly improved due to the adjustment path of the inductors 50G and 41L, and an adjustment path by electromagnetic field coupling generated between the inductor 60 and the inductor 42L.

Note that in the above examples, as a matching element on the first external connection terminal P1 side, the inductor 41L as a shunt connection matching element is indicated; as a matching element on the third external connection terminal P3 side, the shunt connection inductor 42L is indicated. However, the following components may be included as the matching elements on the first external connection terminal P1 side and the third external connection terminal P3 side.

Figure 9A:
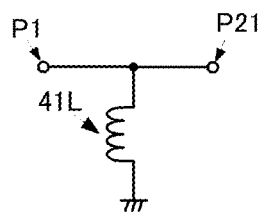
FIGS. 9A to 9H are circuit diagrams showing specific examples of matching circuits of the high frequency modules shown in FIG. 1 to FIG. 8, respectively.
Figure 9E:
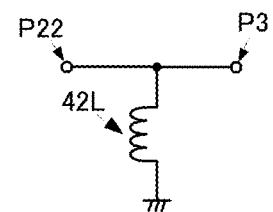
Figure 9B:
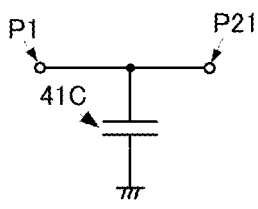
Figure 9F:
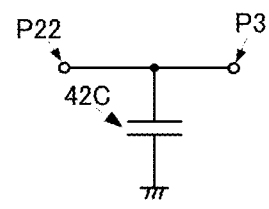
Figure 9C:
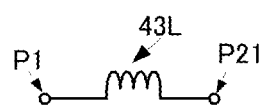
Figure 9G:
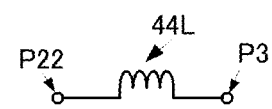
Figure 9D:
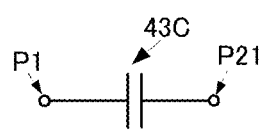

To be specific, the matching element on the first external connection terminal P1 side is not limited to the inductor 41L shown in FIG. 9A, and may be a shunt connection capacitor 41C shown in FIG. 9B, a series connection inductor 43L shown in FIG. 9C, or a series connection capacitor 43C shown in FIG. 9D.

Figure 9H:
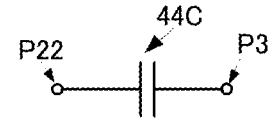

The matching element on the third external connection terminal P3 side is not limited to the inductor 42L shown in FIG. 9E, and may be a shunt connection capacitor 42C shown in FIG. 9F, a series connection inductor 44L shown in FIG. 9G, or a series connection capacitor 44C shown in FIG. 9H.

In the case where an inductor is included as a matching element coupled to the inductor 50 or the inductor 60 by electromagnetic field coupling, strength of inductive coupling is increased. In the case where a capacitor is included as the matching element coupled to the inductor 50 or the inductor 60 by electromagnetic field coupling, strength of capacitive coupling is increased.

However, it may be sufficient for the duplexer according to a preferred embodiment of the present invention to include one of the matching element on the first external connection terminal P1 side and the matching element on the third external connection terminal P3 side. Further, a matching circuit in which the elements shown in FIGS. 9A to 9H are combined may be arranged on the first external connection terminal P1 side (third external connection terminal P3 side).

Figure 10:
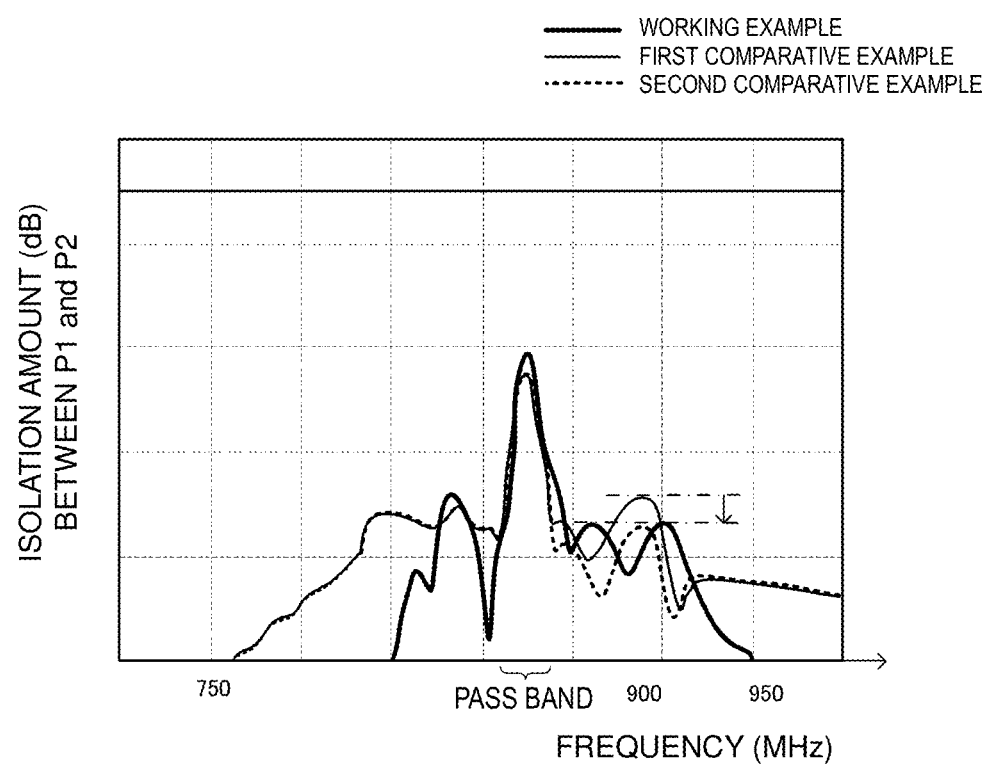
FIG. 10 is a graph showing isolation characteristics between a first external connection terminal and a second external connection terminal of a high frequency module according to a preferred embodiment of the present invention.

Next, FIG. 10 is a graph showing isolation characteristics of the duplexer 101 shown in FIG. 1. The horizontal axis of FIG. 10 represents a frequency, and the longitudinal axis thereof represents an isolation amount. Note that the isolation amount shown in FIG. 10 indicates the amount of isolation between the first external connection terminal P1 and the second external connection terminal P2.

In FIG. 10, a thick solid line indicates isolation characteristics of the duplexer 101 according to a working example of the present application. To be specific, the duplexer 101 according to the working example obstructs electromagnetic field coupling between the inductor 50 and the inductor 60, and an adjustment path is provided by electromagnetic field coupling between the inductor 60 and the inductor 42L. In FIG. 10, a thin solid line indicates isolation characteristics of a duplexer according to a first comparative example. To be specific, in the duplexer according to the first comparative example, an adjustment path that significantly improves isolation is not defined. In FIG. 10, a dotted line indicates isolation characteristics of a duplexer according to a second comparative example. To be specific, the duplexer according to the second comparative example includes the same or substantially the same circuitry as the duplexer 101 according to the working example except that electromagnetic field coupling is generated between the inductor 50 and the inductor 60.

As shown in FIG. 10, the isolation characteristics of the duplexer 101 according to the working example are significantly improved in a range from about 885 MHz to about 897.5 MHz, for example, in comparison with the isolation characteristics of the duplexer according to the first comparative example. Due to the adjustment path defined by the electromagnetic field coupling between the inductor 60 and the inductor 42L, a transmission signal that flows to the third external connection terminal P3 through the transmission signal filter 20 of the duplexer 101 according to the working example is canceled out by a transmission signal that flows to the third external connection terminal P3 through the adjustment path, and thus a transmission signal that comes around and flowing to the second external connection terminal P2 is attenuated. As a result, the isolation characteristics between the transmission and reception are significantly improved. The duplexer according to the second comparative example in which the adjustment path is provided by the inductor 50 and the inductor 60 and the duplexer 101 according to the working example of the present application provide the same or substantially the same level of isolation amount.

Figure 11:
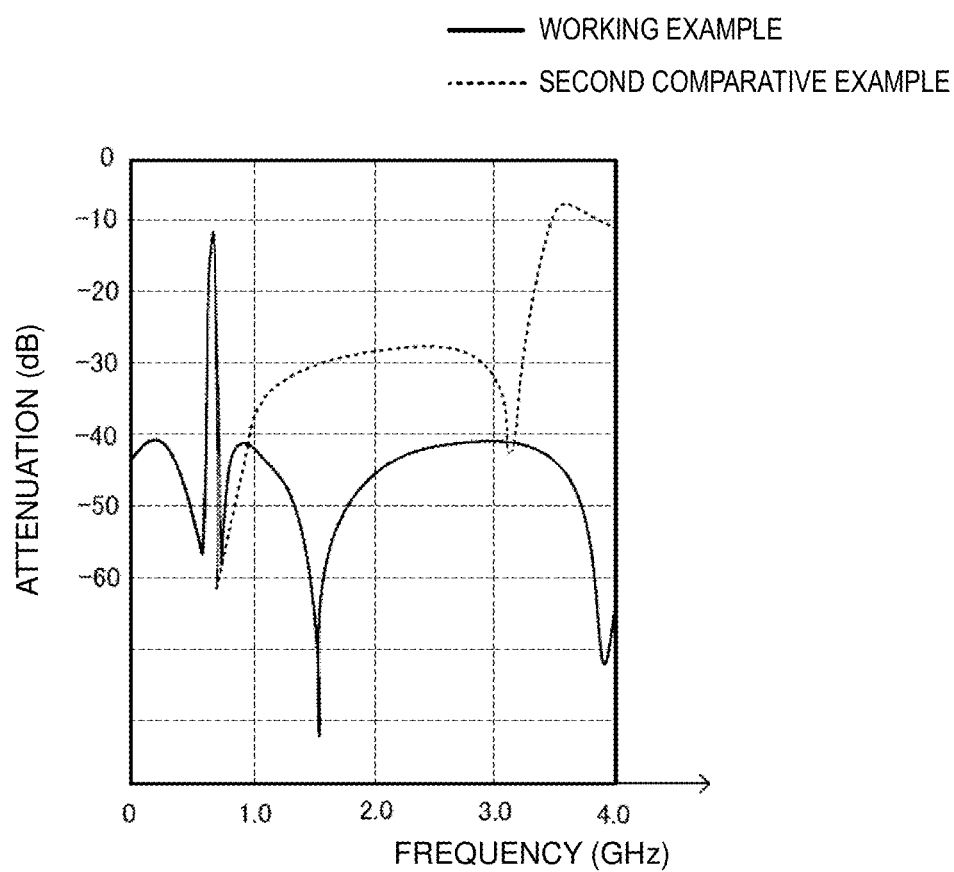
FIG. 11 is a graph showing harmonic attenuation characteristics of a transmission signal filter of a high frequency module according to a preferred embodiment of the present invention.

Next, FIG. 11 is a graph showing harmonic attenuation characteristics of the transmission signal filter 20 of the duplexer 101 shown in FIG. 1. The horizontal axis of FIG. 11 represents a frequency; the longitudinal axis thereof represents attenuation of a transmission signal propagating from the first external connection terminal P1 to the third external connection terminal P3. A solid line in FIG. 11 indicates harmonic attenuation characteristics of the filter 20 of the duplexer 101 according to the working example. A dotted line in FIG. 11 indicates harmonic attenuation characteristics of the transmission filter of the duplexer according to the second comparative example.

Note that the transmission filters (transmission signal filter 20) of the duplexers according to the second comparative example and the working example are respectively set to have an about 800 MHz band as the pass band. The duplexer 101 according to the working example obstructs electromagnetic field coupling between the inductor 50 and the inductor 60, and an adjustment path is provided, by the electromagnetic field coupling, between the inductor 60 and the inductor 42L. The duplexer according to the second comparative example includes the same or substantially the same circuitry as the duplexer 101 according to the working example except that the electromagnetic field coupling is generated between the inductor 50 and the inductor 60.

As shown in FIG. 11, in the duplexer according to the second comparative example, attenuation in the range from about 1.0 GHz to about 3.2 GHz was from about 28 dB to about 40 dB. Meanwhile, in the duplexer 101 according to the working example, attenuation in the range from about 1.0 GHz to about 3.2 GHz was no less than about 40 dB. In other words, in the range from about 2.0 GHz to about 3.0 GHz, which is a harmonic of the transmission band of the transmission signal filter 20, the attenuation in the duplexer 101 according to the working example was greater than the attenuation in the duplexer according to the comparative example by no less than about 10 dB. That is, in the duplexer 101 according to the working example, the harmonic attenuation characteristics of the transmission signal filter 20 were significantly improved in comparison with the duplexer according to the second comparative example.

The inductance of the inductor 50 was adjusted in order to adjust the harmonic attenuation characteristics of the filter 20. However, the isolation characteristics of the duplexer 101 shown in FIG. 10 were hardly affected. The mode and strength of the electromagnetic field coupling between the inductor 60 and the inductor 42L were adjusted in order to adjust the isolation characteristics. However, the harmonic attenuation characteristics of the filter 20 shown in FIG. 11 were hardly affected. In other words, in the duplexer 101 according to the working example, the isolation characteristics and the harmonic attenuation characteristics of the transmission signal filter 20 were able to be separately adjusted. As a result, the duplexer 101 according to the working example was able to significantly improve the isolation characteristics and able to significantly improve the harmonic attenuation characteristics of the transmission signal filter 20 at the same time.

Structures of the duplexers according to preferred embodiments of the present invention are described below. Of the above-discussed duplexers 101 to 101F, the duplexer 101 is taken as a representative and its structure is described below.

First Structure

Figure 12:
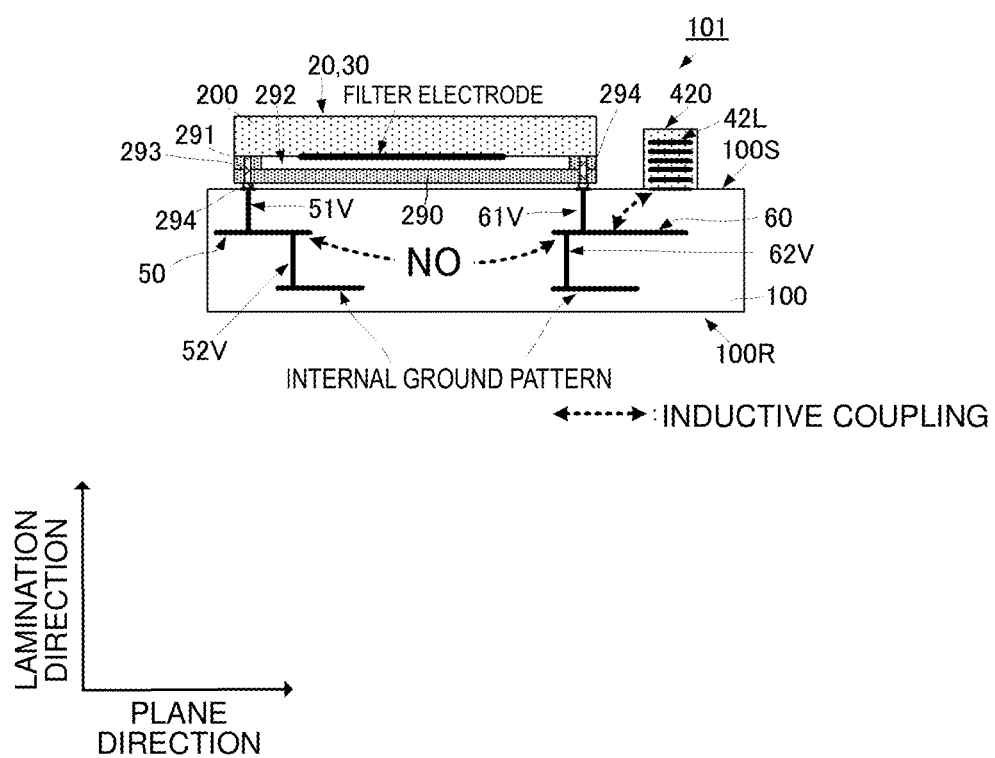
FIG. 12 is a side surface conceptual diagram showing the main structure of a first structure of a high frequency module.

FIG. 12 is a side surface conceptual diagram showing the main structure of a first structure of the duplexer 101. The duplexer 101 includes a lamination substrate 100, a filter substrate 200, a cover layer 290, a side cover layer 291, and a mount circuit element 420. The side surface of the duplexer 101 is a surface orthogonal or substantially orthogonal to a top surface 100S of the lamination substrate 100 on which the filter substrate 200 is mounted.

The lamination substrate 100 is provided by laminating a plurality of dielectric layers. On the top surface (mounting surface) 100S of the lamination substrate 100 and in an inner layer thereof, electrodes with predetermined patterns are formed, and wiring patterns, except for the transmission signal filter 20 and reception signal filter 30 of the duplexer 101, are formed. For example, in the first structure, the inductor 50 and the inductor are provided in or on the inner layer of the lamination substrate 100.

The inductor 50 includes a linear electrode (linear conductor). One end of the linear electrode is electrically connected to a land electrode, with a via conductor 51V interposed therebetween, on which a mounting electrode 294 defining and functioning as the shunt connection terminal P24 of the transmission signal filter 20 is mounted. The land electrode is provided on the top surface 100S of the lamination substrate 100. The other end of the linear electrode defining the inductor 50 is electrically connected to an internal ground pattern provided inside the lamination substrate 100 with a via conductor 52V interposed therebetween.

The inductor 60 includes a linear electrode (linear conductor). One end of the linear electrode is electrically connected to a land electrode, with a via conductor 61V interposed therebetween, on which the mounting electrode 294 defining and functioning as the shunt connection terminal P23 of the transmission signal filter 20 is mounted. The land electrode is provided on the top surface 100S of the lamination substrate 100. The other end of the linear electrode defining the inductor 60 is electrically connected to the internal ground pattern provided inside the lamination substrate 100 with a via conductor 62V interposed therebetween.

External connection electrodes are provided on a bottom surface 100R of the lamination substrate 100, and these external connection electrodes provide the first external connection terminal P1, the second external connection terminal P2, and the third external connection terminal P3. The bottom surface 100R of the lamination substrate 100 is a surface opposing the top surface 100S of the lamination substrate 100 on which the filter substrate 200 is mounted.

The transmission signal filter 20 and the reception signal filter 30 are provided by the filter substrate 200, the cover layer 290, the side cover layer 291, a connection electrode 293, and the mounting electrode 294.

The filter substrate 200 is a plate-shaped piezoelectric substrate. A filter electrode and a wiring pattern are provided on a first principal surface of the filter substrate 200. The filter electrode is, for example, an interdigital transducer (IDT) electrode. With the above structure, by including the IDT electrodes on the principal surface of the piezoelectric substrate, the above-discussed SAW resonators are able to be provided. The plate-shaped cover layer 290 is located on the first principal surface side of the filter substrate 200. The cover layer 290 includes a plate-shaped insulative material and includes the same or substantially the same shape as the filter substrate 200 in a plan view. Further, the cover layer 290 overlaps with the filter substrate 200 in a plan view, and is spaced from the first principal surface of the filter substrate 200 by a predetermined distance. Viewing the cover layer 290 in a plan view indicates viewing the cover layer 290 along the normal direction of the top surface 100S in a state in which the filter substrate 200 is mounted on the top surface 100S of the lamination substrate 100.

The side cover layer 291 is located between the first principal surface of the filter substrate 200 and the cover layer 290. The side cover layer 291 also includes an insulative material, and extends across the whole circumference of the filter substrate 200 and the cover layer 290 only in a predetermined width range from the circumference edge toward the inner side in a plan view. In other words, the side cover layer 291 includes a frame-shaped structure at the center of which an opening is provided.

By the cover layer 290 and the side cover layer 291 being structured as described above, a region of the first principal surface of the filter substrate 200 where the filter electrode is provided is located in an enclosed space 292 by the filter substrate 200, the cover layer 290, and the side cover layer 291. With this, resonance characteristics of the SAW resonators are able to be significantly improved and the desired characteristics as the filter are able to be provided with precision.

The connection electrode 293 includes a shape in which one end thereof contacts with the first principal surface of the filter substrate 200 while the other end thereof is exposed to a surface of the cover layer 290 on the opposite side to the filter substrate 200 side. In this case, the connection electrode 293 passes through the side cover layer 291 and the cover layer 290. The one end of the connection electrode 293 is electrically connected to the wiring pattern provided on the first principal surface of the filter substrate 200.

The mounting electrode 294 electrically connects to the other end of the connection electrode 293 and projects from the surface of the cover layer 290 on the opposite side to the filter substrate 200 side. By providing a plurality of combinations of the connection electrode 293 and the mounting electrode 294, the above-discussed series connection terminal P21, series connection terminal P22, shunt connection terminal P23, shunt connection terminal P24, series connection terminal P33, balanced connection terminal P2A, and balanced connection terminal P2B of the transmission signal filter 20 and the reception signal filter 30 are able to be provided. A bump of solder, Au, or the like may be formed on the other end of the connection electrode 293, and the connection electrode 293 may be electrically connected to the mounting electrode 294 with the bump interposed therebetween.

With the above circuitry and structure, the transmission signal filter 20 and the reception signal filter 30 include a wafer level package (WLP) structure, and thus the transmission signal filter 20 and the reception signal filter 30 are able to be compact.

Then, the transmission signal filter 20 and reception signal filter 30 of the WLP structure are mounted on the top surface 100S of the lamination substrate 100. With this, the transmission signal filter 20 and the reception signal filter 30 are electrically connected to the first external connection terminal P1, the second external connection terminal P2, and the third external connection terminal P3.

The inductor 42L is provided by the mount circuit element 420. Specifically, the mount circuit element 420 includes a rectangular parallelepiped or substantially rectangular parallelepiped housing including an insulative material, and a spiral electrode defining and functioning as the inductor 42L is provided inside the housing. The spiral electrode extends along the circumference of the housing and includes linear electrodes and interlayer connection electrodes. The linear electrodes in the respective layers are electrically connected by the interlayer connection electrode to become a single linear electrode. Both ends of the spiral electrode are electrically connected to external connection electrodes on both end surfaces of the housing opposing each other.

The mount circuit element 420 including the above-discussed circuitry and structure is mounted on the top surface 100S of the lamination substrate 100 with the center axis of the spiral electrode is orthogonal or substantially orthogonal to the top surface 100S. Note that, however, the mount circuit element 420 may be mounted with the center axis of the spiral electrode is parallel or substantially parallel to the top surface 100S.

Although not shown, the inductor 41L is also provided by a mount circuit element. However, the inductors 41L and 42L may be provided by the linear electrodes located on the top surface 100S of the lamination substrate 100. Further, the inductors 41L and 42L may also be provided by the linear electrodes provided inside the lamination substrate 100. Then, as shown in FIG. 12, the mount circuit element 420 that provides the inductor 42L and the linear electrode defining the inductor 60 are close to each other. Thus, inductive coupling is able to be generated between the inductor 42L including the spiral electrode in the mount circuit element 420 and the inductor 60 including the linear electrode inside the lamination substrate 100, as indicated by a thick broken line arrow mark in FIG. 12. Although not shown, in the case where a capacitor is included as the matching element on the third external connection terminal P3 side, capacitive coupling is generated between the linear electrode defining the inductor 60 and the capacitor.

In this case, by changing a distance between the linear electrode defining the inductor 60 and the spiral electrode defining the inductor 42L, strength of the electromagnetic field coupling between the inductor 42L and the inductor 60 is able to be adjusted. Thus, the isolation characteristics of the duplexer 101 are able to be adjusted and the desired isolation characteristics are able to be more precisely provided. Further, by adjusting the length of the linear electrode defining the inductor 60, frequency characteristics of the transmission signal that flows in the adjustment path are able to be adjusted. Furthermore, by adjusting a path length of the adjustment path, the phase of the transmission signal, after passing through the adjustment path, is able to be adjusted at the second external connection terminal P2.

In the first structure of the duplexer 101, the linear electrode defining the inductor 50 and the linear electrode defining the inductor 60 are spaced from each other. In the structure shown in FIG. 12, the linear electrodes are spaced from each other in a plane direction. For example, the inductor 60 and the inductor 50 are spaced by the distance therebetween longer than the distance between the inductor 60 and the inductor 42L. As shown in the side surface conceptual diagram of FIG. 12, the inductor 50 is located on one side surface side of the lamination substrate 100; the inductor 60 is located on the other side surface side of the lamination substrate 100 opposing the one side surface side, for example, in a region overlapping with the mount circuit element 420 in a plan view of the duplexer 101. Because of this, inductive coupling between the inductor 50 and the inductor 60 is not generated. The linear electrodes may be spaced from each other in a lamination direction in addition to the plane direction. Further, a circuit to obstruct inductive coupling between the inductor 50 and the inductor 60 may be provided between the inductors 50 and 60. For example, by providing a ground or the like between the inductor 50 and the inductor 60, inductive coupling between the inductors 50 and 60 may be obstructed.

Further, in order to obstruct inductive coupling between the inductor 50 and the inductor 60, the linear electrode defining the inductor 50 and the linear electrode defining the inductor 60 may be arranged with longitudinal directions thereof differing from each other.

Second Structure

Figure 13:
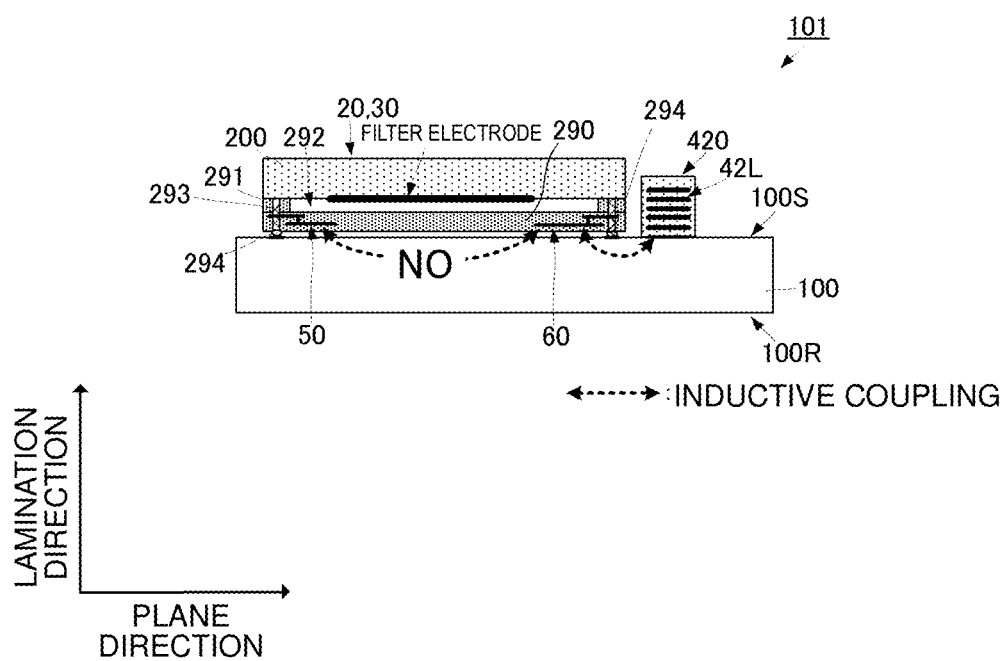
FIG. 13 is a side surface conceptual diagram showing the main structure of a second structure of a high frequency module.

Next, FIG. 13 is a side surface conceptual diagram showing the main structure of a second structure of the duplexer 101. Although, in the example shown in FIG. 12, the inductor 50 and the inductor 60 are provided inside the lamination substrate 100, they may be provided not inside the lamination substrate 100 but in the cover layer 290 as shown in FIG. 13. In the structure shown in FIG. 13, the inductor 50 and the inductor 60 include linear electrodes. Then, the mount circuit element 420 that provides the inductor 42L and the linear electrode defining the inductor 60 are close to each other. As discussed above, inductive coupling is able to be generated between the inductor 42L and the inductor 60 as indicated by a thick broken line arrow mark in FIG. 13.

Also in the second structure, the linear electrode defining the inductor 50 and the linear electrode defining the inductor 60 are spaced from each other in the plane direction. For example, the inductor 60 and the inductor 50 are spaced by the distance therebetween longer than the distance between the inductor 60 and the inductor 42L. As shown in the side surface conceptual diagram of FIG. 13, the inductor 50 is located on one end side of the cover layer 290 while the inductor 60 is located on the other end side of the cover layer 290 opposing the one end thereof. With this structure, as discussed above, inductive coupling is not generated between the inductor 50 and the inductor 60.

Third Structure

Figure 14:
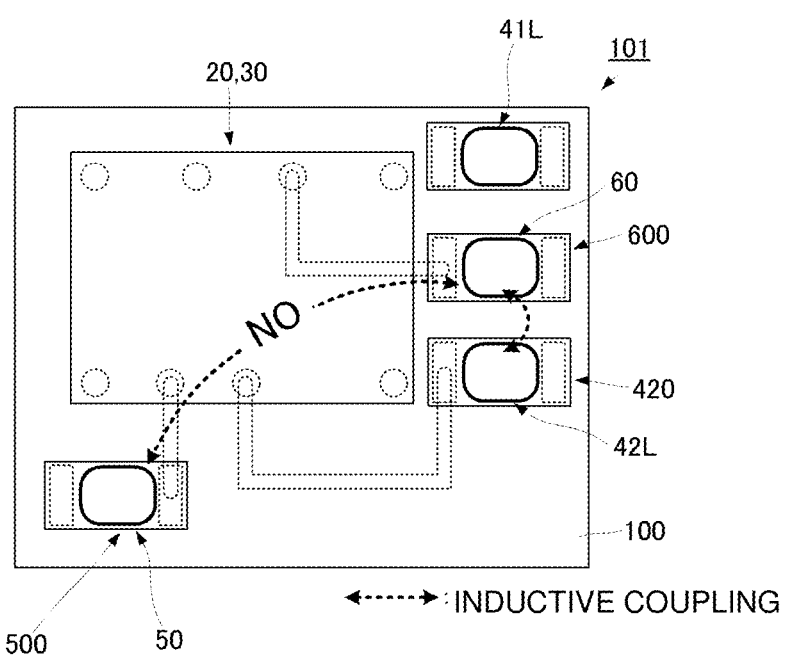
FIG. 14 is a top surface conceptual diagram showing the main structure of a third structure of a high frequency module.
Figure 14:
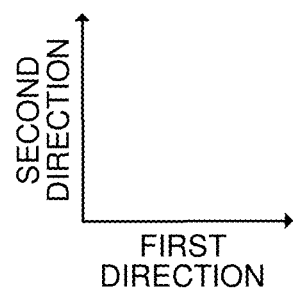

Next, FIG. 14 is a top surface conceptual diagram showing the main structure of a third structure of the duplexer 101. In the third structure, the inductor 50 and the inductor 60, like the inductor 42L, are each provided by a mount circuit element (for example, a chip inductor) mounted on the top surface 100S of the lamination substrate 100. In other words, the inductor 50 and the inductor 60 are each provided by a mount circuit element including a housing with a rectangular parallelepiped shape or a substantially rectangular parallelepiped shape that includes an insulative material.

As shown in FIG. 14, the inductor 50 is provided by a mount circuit element 500. The inductor 60 is provided by a mount circuit element 600. Then, the mount circuit element 420 that provides the inductor 42L and the mount circuit element 600 that provides the inductor 60 are close to each other.

In the third structure, the mount circuit element 500 that provides the inductor 50 and the mount circuit element 600 that provides the inductor 60 are spaced from each other in the plane direction. Note that the plane direction is a direction parallel or substantially parallel to the top surface 100S of the lamination substrate 100. In FIG. 14, a first direction in the plane direction and a second direction in the plane direction are orthogonal or substantially orthogonal to each other. For example, the inductor 60 and the inductor 50 are spaced by the distance therebetween longer than the distance between the inductor 60 and the inductor 42L. The mount circuit element 500 that provides the inductor 50 is located at a side, which is positioned on the downstream side of the first direction, of the sides of the lamination substrate 100 parallel or substantially parallel to the second direction in a plan view; the mount circuit element 600 that provides the inductor 60 is located at a side, which is positioned on the upstream side of the first direction, of the sides of the lamination substrate 100 parallel or substantially parallel to the second direction.

Strength of the inductive coupling generated between the inductor 60 and the inductor 42L is able to be adjusted by the distance between the mount circuit element 600 and the mount circuit element 420.

Likewise, in order to obstruct electromagnetic field coupling between the inductor 50 and the inductor 60, the mount circuit element 500 and the mount circuit element 600 are arranged with the longitudinal directions thereof not opposing each other.

Further, in order to obstruct the electromagnetic field coupling between the inductor 50 and the inductor 60, the center axis of the spiral electrode in the mount circuit element 500 and the center axis of the spiral electrode in the mount circuit element 600 may be set to be orthogonal or substantially orthogonal to each other.

Fourth Structure

Figure 15:
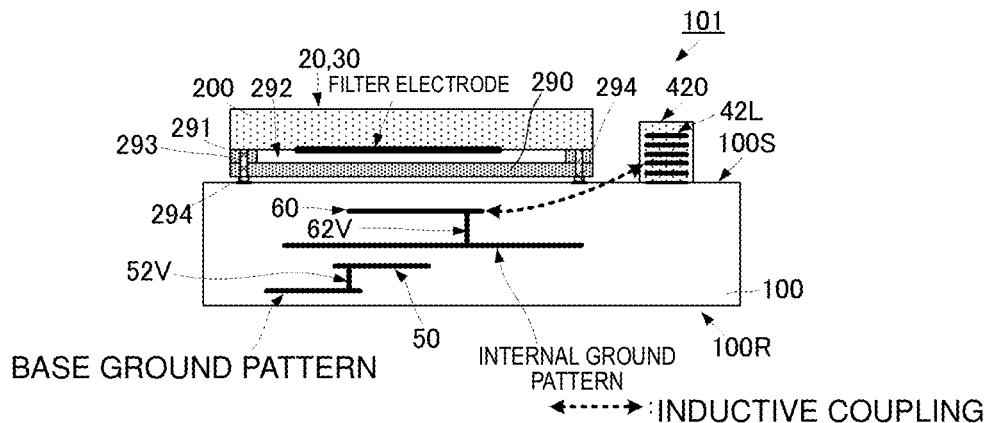
FIG. 15 is a side surface conceptual diagram showing the main structure of a fourth structure of a high frequency module.
Figure 15:
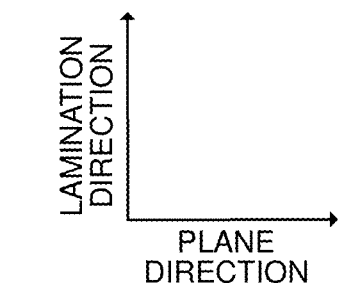

Next, FIG. 15 is a side surface conceptual diagram showing the main structure of a fourth structure of the duplexer 101. The fourth structure differs from the first structure shown in FIG. 12 in a point that a linear electrode defining the inductor 50 and a linear electrode defining the inductor 60 are arranged with an internal ground pattern interposed therebetween inside the lamination substrate 100.

As shown in FIG. 15, the linear electrode defining the inductor 50 is electrically connected to the internal ground pattern with a via conductor 52V interposed therebetween. The linear electrode defining the inductor 60 is electrically connected to a base ground pattern different from the internal ground pattern with a via conductor 62V interposed therebetween. The linear electrode defining the inductor 50 is located at a position in the lamination direction relative to the internal ground pattern. The linear electrode defining the inductor 60 is located at a position on the opposite side in the lamination direction relative to the internal ground pattern. With this, inductive coupling is not generated between the linear electrode defining the inductor 50 and the linear electrode defining the inductor 60 even if they include an overlapping portion when the lamination substrate 100 being viewed in the lamination direction.

The linear electrode defining the inductor 50 and the linear electrode defining the inductor 60 may be arranged with the internal ground pattern interposed therebetween and to not overlap with each other when the lamination substrate 100 being viewed in the lamination direction. With this, inductive coupling between the linear electrodes is further significantly reduced or prevented from being generated. Furthermore, it is sufficient that the inductor 50 and the inductor 60 do not overlap with each other when the lamination substrate 100 being viewed in the lamination direction, and one of them may be provided in the cover layer 290, on the top surface 100S of the lamination substrate 100, or the like.

Although, in FIG. 15, the inductor 50 and the inductor 60 include the internal ground pattern interposed therebetween in the lamination direction, the fourth structure of the duplexer 101 may be in a mode in which the internal ground pattern is interposed in the plane direction.

Fifth Structure

Figure 16:
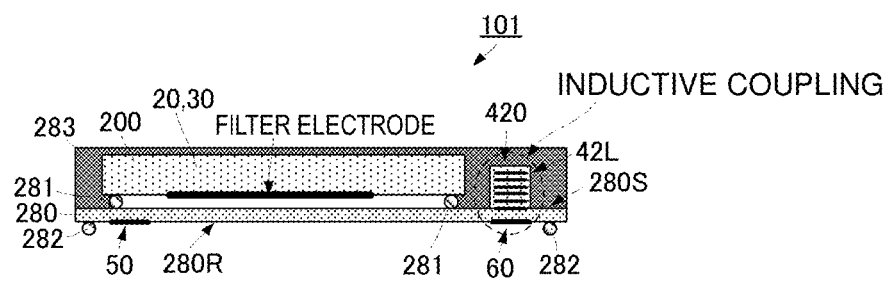
FIG. 16 is a side surface conceptual diagram showing the main structure of a fifth structure of a high frequency module.
Figure 16:
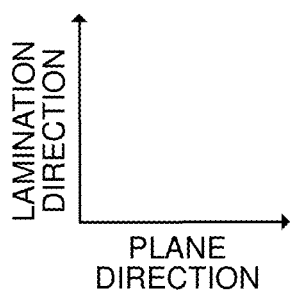

Next, FIG. 16 is a side surface conceptual diagram showing the main structure of a fifth structure of the duplexer 101. The duplexer 101 shown in FIG. 16 is provided with a chip sized package (CSP) structure.

The duplexer 101 includes the filter substrate 200. A filter electrode, a wiring pattern, and the like are provide on the first principal surface of the filter substrate 200 to provide the transmission signal filter 20 and the reception signal filter 30 as discussed above.

The duplexer 101 further includes a filter mounting substrate 280. The filter mounting substrate 280 includes, for example, an alumina substrate, and an area thereof is larger than that of the filter substrate 200 by a predetermined amount in a plan view. An electrode with a predetermined pattern is provided in or on the filter mounting substrate 280.

The filter substrate 200 is mounted on a top surface (mounting surface) 280S of the filter mounting substrate 280 with bump conductors 281 with the first principal surface of the filter substrate 200 facing the filter mounting substrate 280 side. Further, the mount circuit element 420 defining the inductor 42L is mounted on the top surface 280S of the filter mounting substrate 280. On a bottom surface 280R of the filter mounting substrate 280, linear electrodes defining the inductors 50 and 60 as well as external connection bump conductors 282 are provided.

The top surface 280S of the filter mounting substrate 280 is coated with a resin layer 283. However, an IDT electrode is not coated with the resin layer 283, and a section of the IDT electrode includes a hollow structure. With this, the filter electrode and the wiring pattern are able to be significantly reduced or prevented from being exposed to an external environment, resonance characteristics of SAW resonators are able to be significantly improved, and the desired characteristics as the filter are able to be provided with precision.

A spiral electrode defining the inductor 42L and a linear electrode defining the inductor 60 at least partially overlap with each other in a plan view of the lamination substrate 100. Thus, inductive coupling is able to be generated between the inductor 42L and the inductor 60 as shown in FIG. 16. In particular, in the circuitry and structure of the present preferred embodiment, stronger inductive coupling is able to be provided with ease because an interval (distance) between the spiral electrode defining the inductor 42L and the linear electrode defining the inductor 60 are able to be shortened.

Further, as shown in FIG. 16, the linear electrode defining the inductor 50 and the linear electrode defining the inductor 60 are spaced from each other in the plane direction. For example, the inductor 60 and the inductor 50 are arranged with the distance therebetween longer than the distance between the inductor 60 and the inductor 42L. As shown in the side surface conceptual diagram of FIG. 16, the inductor 50 is located on one end side of the bottom surface 100R of the filter mounting substrate 280; the inductor 60 is located on the other end side of the bottom surface 100R of the filter mounting substrate 280 opposing the one end thereof, for example, in a region overlapping with the inductor 42L in a plan view of the duplexer 101. This obstructs inductive coupling between the inductor 50 and the inductor 60.

In addition, the duplexer 101 is able to be compact and thin because the whole of the duplexer 101 is included in the CSP structure.

In the structures discussed above, although the example in which an inductor is included as a matching circuit is described, a case of the matching circuit being a capacitor is able to be implemented in a similar structure as well. For example, in place of the mount circuit element 420 including a spiral electrode, a mount lamination capacitor element may be included.

Although the above-discussed transmission signal filter 20 is a ladder connection filter, the transmission signal filter 20 may be, for example, a longitudinally coupled resonator filter. Also in this case, by adjusting the inductive coupling or capacitive coupling between the above-discussed matching circuit and inductor, a high frequency module with significantly improved isolation characteristics is able to be provided.

Moreover, the preferred embodiments of the present invention are able to be applied to high frequency modules by using a bare chip filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency module comprising:
a shared terminal electrically connected to an antenna;
a transmission terminal;
a reception terminal;
a transmission filter electrically connected between the shared terminal and the transmission terminal;
a reception filter electrically connected between the shared terminal and the reception terminal; and
an antenna side matching element electrically connected between the shared terminal and a connection portion of the transmission filter and the reception filter, or a transmission side matching element electrically connected between the transmission terminal and the transmission filter; wherein
the transmission filter includes:
a plurality of serial arm resonators electrically connected in series to a serial arm electrically connecting the shared terminal and the transmission terminal;
a plurality of parallel arm resonators each electrically connected in series to each of a plurality of parallel arms electrically connecting the serial arm and a ground;
a first inductor electrically connected between the ground and a connection end electrically connecting at least two parallel arm resonators of the plurality of parallel arm resonators; and
a second inductor electrically connected between the ground and one parallel arm resonator different from the at least two parallel arm resonators of the plurality of parallel arm resonators;
the second inductor and at least one element selected from a group including the antenna side matching element, the transmission side matching element, and a portion of the serial arm in the transmission filter overlap with each other in a plan view;
the first inductor and the second inductor do not overlap with each other in the plan view; and
a distance between the first inductor and the second inductor is longer than a distance between the second inductor and the at least one of the antenna side matching element, the transmission side matching element, and the portion of the serial arm in the transmission filter.

2. The high frequency module according to claim 1, wherein the high frequency module includes the first inductor electromagnetic field coupled to one element selected from the group including the antenna side matching element, the transmission side matching element, and a portion of the serial arm in the transmission filter.

3. The high frequency module according to claim 1, further comprising:
a reception side matching element electrically connected between the reception terminal and the reception filter; wherein
the high frequency module includes the first inductor electromagnetic field coupled to at least one element selected from a group including the antenna side matching element, the transmission side matching element, the reception side matching element, a portion of the serial arm in the transmission filter, and a reception path from one end to the other end of the reception filter.

4. The high frequency module according to claim 1, further comprising:
a substrate; wherein
the transmission filter is mounted in or on the substrate; and
the first inductor and the second inductor are located at different positions in a plan view of the substrate.

5. The high frequency module according to claim 4, wherein
one of the first inductor and the second inductor is a chip inductor on a principal surface of the substrate; and
the other one of the first inductor and the second inductor is inside the substrate.

6. The high frequency module according to claim 4, wherein the first inductor and the second inductor are arranged such that the ground inside the substrate is interposed between the first and second inductors.

7. The high frequency module according to claim 1, wherein the reception filter includes a series connection terminal, a plurality of serial arm resonators, a matching circuit, and a pair of balanced connection terminals.

8. The high frequency module according to claim 7, wherein the plurality of serial arm resonators of the reception filter includes at least one longitudinally coupled serial arm resonator.

9. The high frequency module according to claim 1, wherein the ground is located between the first inductor and the second inductor.

10. The high frequency module according to claim 1, wherein the antenna side matching element or the transmission side matching element is a third inductor.

11. The high frequency module according to claim 10, wherein the distance between the first inductor and the second inductor is longer than a distance between the second inductor and the third inductor.

12. The high frequency module according to claim 1, wherein the antenna side matching element or the transmission side matching element is a capacitor.

13. The high frequency module according to claim 1, further comprising:
   a lamination substrate;
   a filter substrate that includes the transmission filter and the reception filter; and
   at least one cover layer.

14. The high frequency module according to claim 13, wherein the lamination substrate includes a plurality of dielectric layers.

15. The high frequency module according to claim 13, wherein wiring patterns are provided on an upper surface of the lamination substrate and external connection electrodes are provided on a lower surface of the lamination substrate.

16. The high frequency module according to claim 13, wherein the filter substrate is a piezoelectric substrate that is mounted on an upper surface of the lamination substrate.

17. The high frequency module according to claim 13, wherein the at least one cover layer includes an insulative material.

18. A high frequency module comprising:
   a shared terminal electrically connected to an antenna;
   a transmission terminal;
   a reception terminal;
   a transmission filter electrically connected between the shared terminal and the transmission terminal;
   a reception filter electrically connected between the shared terminal and the reception terminal; and
   an antenna side matching element electrically connected between the shared terminal and a connection portion of the transmission filter and the reception filter, or a transmission side matching element electrically connected between the transmission terminal and the transmission filter; wherein
the transmission filter includes:
a plurality of serial arm resonators electrically connected in series to a serial arm electrically connecting the shared terminal and the transmission terminal;
a plurality of parallel arm resonators each electrically connected in series to each of a plurality of parallel arms electrically connecting the serial arm and a ground;
a first inductor electrically connected between the ground and a connection end electrically connecting at least two parallel arm resonators of the plurality of parallel arm resonators; and
a second inductor electrically connected between the ground and one parallel arm resonator different from the at least two parallel arm resonators of the plurality of parallel arm resonators;
the second inductor and at least one element selected from a group including the antenna side matching element, the transmission side matching element, and a portion of the serial arm in the transmission filter overlap with each other in a plan view;
the first inductor and the second inductor do not overlap with each other in the plan view; and
the ground is located between the first inductor and the second inductor, or a distance between the first inductor and the second inductor is longer than a distance between the second inductor and the at least one of the antenna side matching element, the transmission side matching element, and the portion of the serial arm in the transmission filter.

* * * * *